United States Patent
Tsutsumi et al.

(10) Patent No.: US 10,396,804 B2
(45) Date of Patent: Aug. 27, 2019

(54) CIRCUIT DEVICE, PHYSICAL QUANTITY MEASUREMENT DEVICE, ELECTRONIC APPARATUS, AND VEHICLE

(71) Applicant: Seiko Epson Corporation, Tokyo (JP)

(72) Inventors: Akio Tsutsumi, Chino (JP); Katsuhiko Maki, Chino (JP)

(73) Assignee: Seiko Epson Corporation (JP)

( * ) Notice: Subject to any disclaimer, the term of this patent is extended or adjusted under 35 U.S.C. 154(b) by 8 days.

(21) Appl. No.: 15/712,796

(22) Filed: Sep. 22, 2017

(65) Prior Publication Data

US 2018/0091160 A1 Mar. 29, 2018

(30) Foreign Application Priority Data

Sep. 27, 2016 (JP) ................... 2016-187861

(51) Int. Cl.
| | |
|---|---|
| *H03K 3/00* | (2006.01) |
| *H03L 7/081* | (2006.01) |
| *H03H 11/26* | (2006.01) |
| *G04F 10/00* | (2006.01) |
| *H03K 5/13* | (2014.01) |
| *H03K 5/131* | (2014.01) |

(52) U.S. Cl.
CPC .......... *H03L 7/0814* (2013.01); *G04F 10/005* (2013.01); *H03H 11/26* (2013.01); *H03K 5/13* (2013.01); *H03K 5/131* (2013.01); *H03L 7/0816* (2013.01)

(58) Field of Classification Search
None
See application file for complete search history.

(56) References Cited

U.S. PATENT DOCUMENTS

| | | | |
|---|---|---|---|
| 7,259,601 B2 * | 8/2007 | Zarate | H03L 7/0814 327/158 |
| 7,304,510 B2 | 12/2007 | Matsuta | |
| 7,486,119 B2 | 2/2009 | Lee | |
| 7,830,191 B2 | 11/2010 | Kojima et al. | |
| 8,222,935 B2 * | 7/2012 | Awata | G01S 19/29 327/147 |
| 8,421,661 B1 | 4/2013 | Jee et al. | |

(Continued)

FOREIGN PATENT DOCUMENTS

| | | |
|---|---|---|
| JP | 64-079687 A | 3/1989 |
| JP | 05-087954 A | 4/1993 |

(Continued)

*Primary Examiner* — Lincoln D Donovan
*Assistant Examiner* — Khareem E Almo
(74) *Attorney, Agent, or Firm* — Harness, Dickey & Pierce, P.L.C.

(57) ABSTRACT

A circuit device includes a first circuit, a second circuit, and a comparator array section. The first circuit has a first DLL circuit having a plurality of delay elements, and delays a first signal. The second circuit has a second DLL circuit having a plurality of delay elements, and delays a second signal. The comparator array section has a plurality of phase comparators arranged in a matrix, the first delayed signal group from the first circuit and the second delayed signal group from the second circuit are input to the comparator array section, and the comparator array section outputs a digital signal corresponding to a time difference in the transition timing between the first signal and the second signal.

20 Claims, 16 Drawing Sheets

(56) References Cited

U.S. PATENT DOCUMENTS

| | | |
|---|---|---|
| 8,462,840 B2 | 6/2013 | Chen et al. |
| 8,552,776 B2 | 10/2013 | Kwak et al. |
| 9,068,896 B2 | 6/2015 | Yun et al. |
| 10,247,621 B1 | 4/2019 | Partridge et al. |
| 2002/0033736 A1 | 3/2002 | Heymann |
| 2003/0076181 A1 | 4/2003 | Tabatabaei et al. |
| 2006/0040632 A1 | 2/2006 | Buznitsky et al. |
| 2007/0046347 A1* | 3/2007 | Lee ............... H03L 7/0814 327/158 |
| 2008/0048739 A1* | 2/2008 | Nakaya ........... H03L 7/0814 327/146 |
| 2008/0136479 A1* | 6/2008 | You ................ G06F 1/04 327/161 |
| 2009/0184741 A1* | 7/2009 | Suda ............... G01R 31/31922 327/158 |
| 2009/0256577 A1* | 10/2009 | Hasumi ........... H03L 7/0812 324/555 |
| 2010/0052751 A1* | 3/2010 | Abe ................ G11C 7/1051 327/158 |
| 2010/0182186 A1 | 7/2010 | Lin et al. |
| 2011/0128055 A1* | 6/2011 | Pelgrom ......... G01R 31/31709 327/156 |
| 2011/0169673 A1 | 7/2011 | Henzler |
| 2011/0304361 A1 | 12/2011 | Henzler et al. |
| 2014/0361840 A1 | 12/2014 | Liu et al. |
| 2015/0061781 A1* | 3/2015 | Shimura ............ H03L 7/07 331/25 |
| 2015/0145572 A1 | 5/2015 | Sato |
| 2016/0103423 A1 | 4/2016 | Chang et al. |
| 2016/0173108 A1* | 6/2016 | Oshita ............ G11C 11/4076 365/189.05 |
| 2017/0230051 A1* | 8/2017 | Oshita ............ G11C 11/4076 |
| 2018/0053058 A1 | 2/2018 | Konishi et al. |
| 2018/0088160 A1 | 3/2018 | Maki et al. |
| 2018/0088536 A1 | 3/2018 | Kurashina et al. |
| 2018/0091158 A1 | 3/2018 | Sudo et al. |
| 2018/0091159 A1* | 3/2018 | Tsutsumi ............ H03L 7/087 |

FOREIGN PATENT DOCUMENTS

| | | |
|---|---|---|
| JP | 2007-110370 A | 4/2007 |
| JP | 2009-246484 A | 10/2009 |
| JP | 2010-119077 A | 5/2010 |

* cited by examiner

CIRCUIT DEVICE, PHYSICAL QUANTITY MEASUREMENT DEVICE, ELECTRONIC APPARATUS, AND VEHICLE

BACKGROUND

1. Technical Field

The present invention relates to a circuit device, a physical quantity measurement device, an electronic apparatus, a vehicle, and so on.

2. Related Art

In the past, there has been known a circuit device having a time-to-digital conversion circuit. The time-to-digital conversion circuit converts time into a digital value. As related art examples of a circuit device having such a time-to-digital conversion circuit, there are known related art technologies disclosed in, for example, JP-A-2007-110370 (Document 1), JP-A-2009-246484 (Document 2), and JP-A-2010-119077 (Document 3).

In the related art technologies of Documents 1 through 3, the time-to-digital conversion is realized using a so-called vernier delay circuit. In the vernier delay circuit, the time-to-digital conversion is realized using a delay element as a semiconductor element.

Further, in the past, there has been known a so-called 2D-vernier type time-to-digital conversion circuit as the time-to-digital conversion circuit using the vernier delay circuit. In this technology, phase comparison is performed between a plurality of delayed signals from a first delay circuit for delaying a start signal and a plurality of delayed signals from a second delay circuit for delaying a stop signal with a phase comparator array arranged in a matrix.

In the 2D-vernier type time-to-digital conversion circuit described above, the more accurate the delay time is in the delay circuits for delaying the start signal and the stop signal, the higher the accuracy of the time-to-digital conversion can be made.

However, since the delay time in each delay stage varies due to a variation (e.g., a process variation, a variation depending on temperature, and a variation depending on the voltage) of delay elements as semiconductor elements, there is a problem that the accuracy of the time-to-digital conversion is reduced. For example, in the 2D-vernier type time-to-digital conversion circuit, minute time can be measured by using a difference in delay time between two delay circuits. However, there is a possibility that the influence of the variation increases relatively to the fine resolution, and thus, the conversion becomes inaccurate.

SUMMARY

An advantage of some aspects of the invention is to provide a circuit device, a physical quantity measurement device, an electronic apparatus, a vehicle and so on making high-performance time-to-digital conversion possible in a 2D-vernier type time-to-digital conversion circuit.

The advantage can be achieved by the following configurations.

An aspect of the invention relates to a circuit device including a first circuit having a first delay locked loop (DLL) circuit having a plurality of delay elements, and adapted to delay a first signal, a second circuit having a second DLL circuit having a plurality of delay elements, and adapted to delay a second signal, and a comparator array section, which has a plurality of phase comparators arranged in a matrix, to which a first delayed signal group from the first circuit and a second delayed signal group from the second circuit are input, and which outputs a digital signal corresponding to a time difference in transition timing between the first signal and the second signal.

According to the aspect of the invention, since the first circuit for delaying the first signal has the first DLL circuit, and the second circuit for delaying the second signal has the second DLL circuit, the delay time of the delayed signal of the first and second delayed signal groups to be input to the comparator array section is adjusted by the first and second DLL circuits. Thus, in the 2D-vernier type time-to-digital conversion circuit, the high-performance time-to-digital conversion becomes possible.

In the aspect of the invention, a phase comparator located in an i-th column and a j-th row of the comparator array section (i, j are each an integer no smaller than 1) may perform phase comparison between an i-th delayed signal out of the first delayed signal group from the first circuit and a j-th delayed signal out of the second delayed signal group from the second circuit.

According to the aspect of the invention with this configuration, the phase comparison between the i-th delayed signal obtained by delaying the first signal and the j-th delayed signal obtained by delaying the second signal having the time difference with respect to the first signal is performed. Thus, it becomes possible to convert the time difference in the transition timing between the first signal and the second signal into a digital value. According to an aspect of the invention, since the delay time of the i-th and j-th delayed signals is adjusted by the first and second DLL circuits, the high-performance time-to-digital conversion becomes possible.

In the aspect of the invention, in the first DLL circuit, a delay amount of a delay element may be adjusted using a difference in frequency between a first clock signal and a second clock signal, and in the second DLL circuit, a delay amount of a delay element may be adjusted using a difference in frequency between the first clock signal and a third clock signal.

With this configuration, it becomes possible to adjust the delay amounts of the delay elements in the first and second DLL circuits using the difference in frequency between the two clock signals instead of adjusting the total delay time in a lump so as to be equal to one cycle of the clock signal in the DLL circuits. Thus, it becomes possible to further reduce the influence of the variation due to the semiconductor process and so on in the delay elements of the first and second DLL circuits, and the delay time of the first and the second delayed signal groups output by the first and second circuits can be made high in accuracy.

In the aspect of the invention, the first circuit may include a first adjustment circuit to which a delayed clock signal from the delay element of the first DLL circuit, and the second clock signal with a second clock frequency lower than a first clock frequency of the first clock signal are input, and which adjust the delay amount of the delay element of the first DLL circuit using the frequency difference between the first clock frequency and the second clock frequency, and the second circuit may include a second adjustment circuit to which a delayed clock signal from the delay element of the second DLL circuit, and the third clock signal with a third clock frequency lower than the first clock frequency of the first clock signal are input, and which adjust the delay amount of the delay element of the second DLL circuit using the frequency difference between the first clock frequency and the third clock frequency.

As described above, since the delayed clock signals obtained by delaying the first clock signal with the first DLL circuit, and the second clock signal are input to the first adjustment circuit, it becomes possible to perform the adjustment of the delay amounts using the difference in frequency between the first and second clock signals based on the delayed clock signal and the second clock signal. Further, since the delayed clock signals obtained by delaying the first clock signal with the second DLL circuit, and the third clock signal are input to the second adjustment circuit, it becomes possible to perform the adjustment of the delay amounts using the difference in frequency between the first and third clock signals based on the delayed clock signal and the third clock signal.

In the aspect of the invention, the first clock signal may be a clock signal generated using a first resonator, the second clock signal may be a clock signal generated using a second resonator, and the third clock signal may be a clock signal generated using a third resonator.

By using the clock signal generated by the resonator as described above, it is possible to obtain the oscillation frequency high in accuracy compared to the method not using the resonator, and make the delay amounts of the delay elements high in accuracy. In other words, in the time-to-digital conversion, the improvement of the accuracy of the time-to-digital conversion can be achieved compared to the method not using the resonator.

In the aspect of the invention, the first circuit may have a first delay circuit adapted to delay the first signal with a delay amount corresponding to a signal delay in the first DLL circuit, and output the first delayed signal group to the comparator array section, and the second circuit may have a second delay circuit adapted to delay the second signal with a delay amount corresponding to a signal delay in the second DLL circuit, and output the second delayed signal group to the comparator array section.

According to the aspect of the invention with this configuration, the first signal is delayed by the first delay circuit for delaying the first signal with the delay amount corresponding to the signal delay in the first DLL circuit, and the second signal is delayed by the second delay circuit for delaying the second signal with the delay amount corresponding to the signal delay in the second DLL circuit. Thus, it becomes possible for the first and second circuits to delay the first and second signals to thereby output the first and second delayed signal groups to the comparator array section.

In the aspect of the invention, the first delay circuit may be a replica circuit of the first DLL circuit, and the second delay circuit may be a replica circuit of the second DLL circuit.

According to the aspect of the invention with this configuration, the delay amounts in each of the delay elements in the first and second DLL circuits are adjusted by the feedback of the DLL, and the delay amount of each of the delay elements of the first and second delay circuits as the replica circuits thereof is adjusted with the adjustment values of the delay amounts of the first and second DLL circuits as a result. According to this process, the delay time of the delayed signal of the first and second delayed signal groups input to the comparator array section is adjusted by the first and second DLL circuits, and thus, the high-performance time-to-digital conversion can be realized.

In the aspect of the invention, the first circuit may have a first selector adapted to supply a reference clock signal to the first DLL circuit in a first period, and supply the first signal to the first DLL circuit in a second period, the second circuit may have a second selector adapted to supply a reference clock signal to the second DLL circuit in the first period, and supply the second signal to the second DLL circuit in the second period, and in the second period, to the comparator array section, the first delayed signal group may be input to the comparator array section from the first DLL circuit, and the second delayed signal group may be input from the second DLL circuit.

According to the aspect of the invention with this configuration, by performing the phase comparison between the first and second delayed signal groups obtained by delaying the first and second signals with the first and second DLL circuits in the second period, the time difference between the first signal and the second signal can be measured. Further, since the reference clock signal is input to the first and second DLL circuit in the first period, it becomes possible to adjust the delay amount of the delay element. By performing switching by such a selector, it becomes possible to delay the first and second signals with the first and second DLL, and the high-performance time-to-digital conversion can be realized compared to the case of using the replica circuit.

Another aspect of the invention relates to a physical quantity measurement device including any one of the circuit devices described above, and a first resonator adapted to generate a first clock signal.

In the another aspect of the invention, the physical quantity measurement device may further include a second resonator adapted to generate a second clock signal, and a third resonator adapted to generate a third clock signal.

Still another aspect of the invention relates to an electronic apparatus including any one of the circuit devices described above.

Still another aspect of the invention relates to a vehicle including any one of the circuit devices described above.

BRIEF DESCRIPTION OF THE DRAWINGS

The invention will be described with reference to the accompanying drawings, wherein like numbers reference like elements.

DESCRIPTION OF AN EXEMPLARY EMBODIMENT

A preferred embodiment of the invention will hereinafter be described in detail. It should be noted that the embodiment described hereinafter does not unreasonably limit the content of the invention as set forth in the appended claims, and all of the constituents described in the embodiment are not necessarily essential as the elements for solving the problems of the invention.

1. Circuit Device

Figure 1:
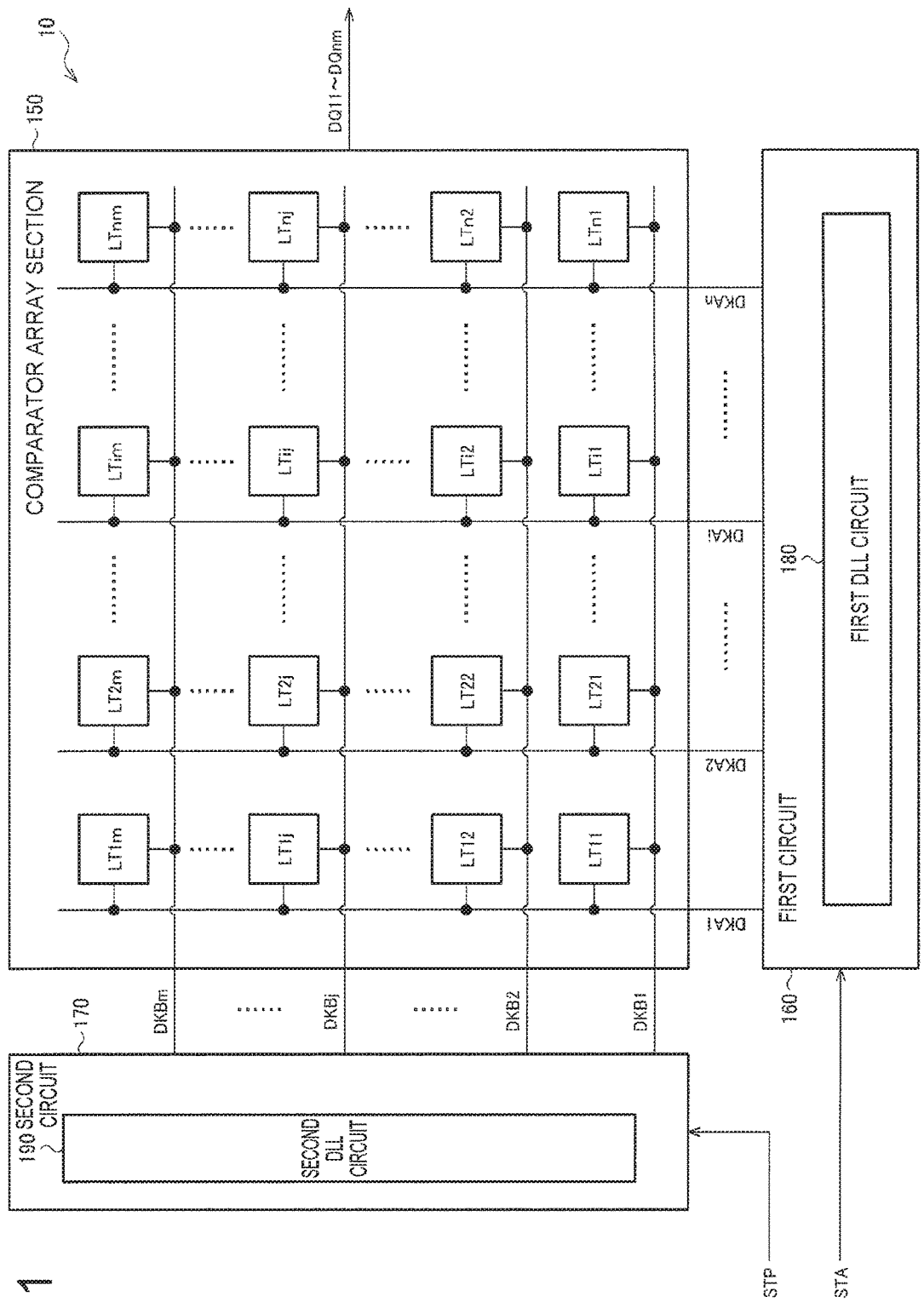
FIG. 1 is a diagram showing a configuration example of a circuit device according to an embodiment of the invention.

FIG. 1 shows a configuration example of a circuit device 10 according to the present embodiment. The circuit device 10 includes a first circuit 160, a second circuit 170, and a comparator array section 150 (a comparator array). The circuit device 10 is realized by, for example, an integrated circuit device (IC). It should be noted that the configuration of the circuit device 10 is not limited to the configuration shown in FIG. 1, but it is possible to adopt a variety of practical modifications such as elimination of some of the constituents or addition of other constituents.

The first circuit 160 has a first DLL circuit 180 (DLL: Delay Locked Loop) having a plurality of delay elements, and delays a first signal STA (e.g., a start signal). The second circuit 170 has a second DLL circuit 190 having a plurality of delay elements, and delays a second signal STP (e.g., a stop signal).

Specifically, the first circuit 160 outputs delayed signals DKA1 through DKAn (a first delayed signal group) generated by delaying the signal STA with the plurality of delay elements. The reference symbol n denotes an integer equal to or greater than 3. For example, the delayed signals DKA1 through DKAn are generated by delaying the signal STA with the DLL circuit 180. Alternatively, the first circuit 160 includes a replica circuit of the DLL circuit 180, and the delayed signals DKA1 through DKAn are generated by delaying the signal STA with the replica circuit. Similarly, the second circuit 170 outputs delayed signals DKB1 through DKBm (a second delayed signal group) generated by delaying the signal STP with the plurality of delay elements. The reference symbol m denotes an integer equal to or greater than 3. For example, the delayed signals DKB1 through DKBm are generated by delaying the signal STP with the DLL circuit 190. Alternatively, the second circuit 170 includes a replica circuit of the DLL circuit 190, and the delayed signals DKB1 through DKBm are generated by delaying the signal STP with the replica circuit.

Here, the DLL circuit is a circuit in which feedback control is performed on the delay amounts of the delay elements based on the output of at least one delay element to lock the delay amounts of the delay elements to the desired delay amounts.

The comparator array section 150 has the plurality of phase comparators arranged in a matrix, the first delayed signal group (DKA1 through DKAn) from the first circuit 160 and the second delayed signal group (DKB1 through DKBm) from the second circuit 170 are input to the comparator array section 150, and the comparator array section 150 outputs a digital signal corresponding to a time difference in the transition timing between the first signal STA and the second signal STP.

Specifically, the comparator array section 150 has n×m phase comparators LT11 through LTnm. For example, the LTij denotes the phase comparator disposed at the i-th column and the j-th row of the matrix. The reference symbol i denotes an integer no smaller than 1 and no larger than n, and the reference symbol j denotes an integer no smaller than 1 and no larger than m. Further, the delayed signal DKAi is input to the phase comparators LTi1 through LTim in the i-th column, and the delayed signal DKBj is input to the phase comparators LT1j through LTnj in the j-th row. The phase comparators LT11 through LTnm respectively output digital signals DQ11 through DQnm, which are the results of the phase comparison. For example, DQij denotes the digital signal output by the phase comparator LTij.

As described above, in the present embodiment, the first circuit 160 for delaying the first signal STA has the first DLL circuit 180, and the second circuit 170 for delaying the second signal STP has the second DLL circuit 190. Thus, the delay time of the delayed signals DKA1 through DKAn, DKB1 through DKBm input to the comparator array section 150 becomes adjusted by the DLL circuit, and high-performance (high-accuracy, high-resolution) time-to-digital conversion becomes possible in the 2D-vernier type time-to-digital conversion circuit. That is, although the delay amounts of the delay elements for generating the delayed signals DKA1 through DKAn, DKB1 through DKBm are varied due to the variation of the semiconductor process and so on in the case in which the DLL circuit is not used as in the related art, the variation of the delay amounts can be reduced in the present embodiment since the DLL circuit is used.

Further, in the present embodiment, the phase comparator LTij in the i-th column and the j-th row of the comparator array section 150 performs the phase comparison between the i-th delayed signal DKAi out of the first delayed signal group from the first circuit 160 and the j-th delayed signal DKBj out of the second delayed signal group from the second circuit 170.

It is assumed that the delay times of the delayed signals DKA1, DKA2, DKA3, . . . with respect to the signal STA are 1Δta, 2Δta, 3Δta, . . . , respectively. Further, it is assumed that the delay times of the delayed signals DKB1, DKB2, DKB3, . . . with respect to the signal STP are 1Δtb, 2Δtb, 3Δtb, . . . , respectively. The delay amount per one stage of the delay element is Δta, Δtb, and there is a relationship of Δta>Δtb. In this case, the difference in delay time between the delayed signal DKAi and the delayed signal DKBj is as follows: i×Δta−j×Δtb=Δtij. In the present embodiment, Δtij and the time difference (TDF in FIG. 2) in transition timing between the signals STA, STP are compared by the phase comparator LTij.

In other words, the phase comparator LTij performs the phase comparison between the transition timing of the delayed signal DKAi obtained by delaying the signal STA as much as i×Δta, and the transition timing of the delayed signal DKBj obtained by delaying the signal STP having the time difference of TDF from the signal STA as much as j×Δtb. The time difference in the transition timing is as follows: i×Δta−(TDF+j×Δtb)=Δtij−TDF. The phase comparison by the phase comparator LTij corresponds to the determination on whether the time difference in the transition timing fulfills Δtij−TDF<0 or Δtij−TDF>0. For example, in the case in which Δt(i−1)(j−1)−TDF<0 and Δtij−TDF>0 are fulfilled, Δt(i−1)(j−1)−TDF<TDF<Δtij can be measured. In this case, the digital signal DQ(i−1)(j−1) output by the phase comparator LT(i−1)(j−1) becomes in, for example, a low level (a first logic level), and the digital signal DQij output by the phase comparator LTij becomes in, for example, a high level (a second logic level). The digital signal value corresponding to TDF=Δtij (or TDF=Δt(i−1)(j−1)) can be obtained from this digital signal, and thus, the time-to-digital conversion is realized. The resolution of the time-to-digital conversion is as follows: Δtij−Δt(i−1)(j−1)=Δta−Δtb=Δt.

As described above, by the phase comparator LTij performing the phase comparison between the delayed signals DKAi, DKBj, it is possible to perform the phase comparison between the transition timing of the delayed signal DKAi obtained by delaying the signal STA and the transition timing of the delayed signal DKBj obtained by delaying the signal STP having the time difference of TDF from the signal STA. Thus, it becomes possible to convert the time difference in the transition timing between the signals STA, STP into a digital value. Further, in the present embodiment, since the delay times of the delayed signals DKAi, DKBj are adjusted by the DLL circuit, high-performance time-to-digital conversion becomes possible.

Figure 2:
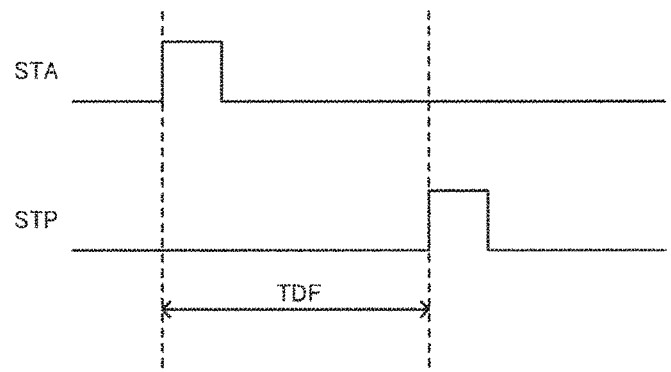
FIG. 2 is a diagram showing a relationship between a first signal and a second signal.

FIG. 2 is a diagram showing the relationship between the signal STA (the first signal, e.g., the start signal) and the signal STP (the second signal, e.g., the stop signal). The circuit device 10 (the time-to-digital conversion circuit) according to the present embodiment converts the time difference TDF in the transition timing between the signal STA and the signal STP into a digital value. The time difference in the transition timing between the signal STA and the signal STP is the time difference between the edges (e.g., between the rising edges, or between the falling edges) of the signal STA and the signal STP. It should be noted that although in FIG. 2, TDF is defined as the time difference between (between the rising edges) the transition timings of the rising edges of the signal STA and the signal STP, but can also be defined as the time difference between (between the falling edges) the transition timings of the falling edges of the signal STA and the signal STP.

Figure 3:
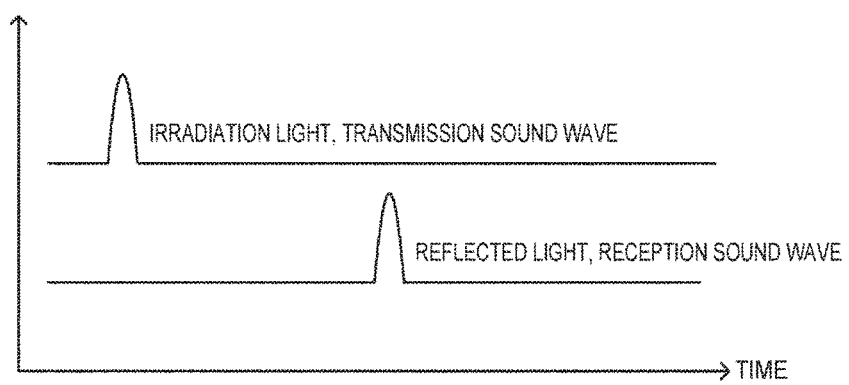
FIG. 3 is a diagram showing an example of physical quantity measurement using the first signal and the second signal.

FIG. 3 is a diagram showing an example of physical quantity measurement using the signals STA, STP. For example, the physical quantity measurement device including the circuit device 10 according to the present embodiment emits the irradiation light (e.g., a laser beam) to an object (e.g., an object in the periphery of a car) using the signal STA. Then, the signal STP is generated due to the reception of the reflected light from the object. For example, the physical quantity measurement device performs waveform shaping on the light reception signal to thereby generate the signal STP. According to this process, by converting the time difference TDF in the transition timing between the signal STA and the signal STP into a digital value, the distance from the object can be measured as a physical quantity using, for example, a time-of-flight (TOF) method, and can be used for, for example, automated driving of a car.

Alternatively, the physical quantity measurement device transmits a transmission sound wave (e.g., an ultrasonic wave) to an object (e.g., a living body) using the signal STA. Then, the signal STP is generated due to the reception of the reception sound wave from the object. For example, the physical quantity measurement device performs waveform shaping on the reception sound wave to thereby generate the signal STP. According to this process, by converting the time difference TDF in the transition timing between the signal STA and the signal STP into a digital value, the distance from the object and so on can be measured, and the measurement of biological information and so on by an ultrasonic wave becomes possible.

It should be noted that in FIG. 2 and FIG. 3, it is also possible to measure the time from when the transmission data is transmitted to when the reception data is received by transmitting the transmission data by the signal STA and using the signal STP due to the reception of the reception data. Further, the physical quantity measured by the physical quantity measurement device according to the present embodiment is not limited to time and the distance, but a variety of physical quantities such as a flow rate, flow speed, a frequency, speed, acceleration, angular velocity, or angular acceleration are conceivable.

Further, although there is mainly described the case of applying the method of the present embodiment to the time-to-digital conversion of converting the time difference in the transition timing between the signals STA, STP into the digital value, the present embodiment is not limited to this case. For example, it is also possible to apply the method of the present embodiment to the time-to-digital conversion for measuring, for example, absolute time, and so on.

2. Detailed Configuration Example of Circuit Device

Figure 4:
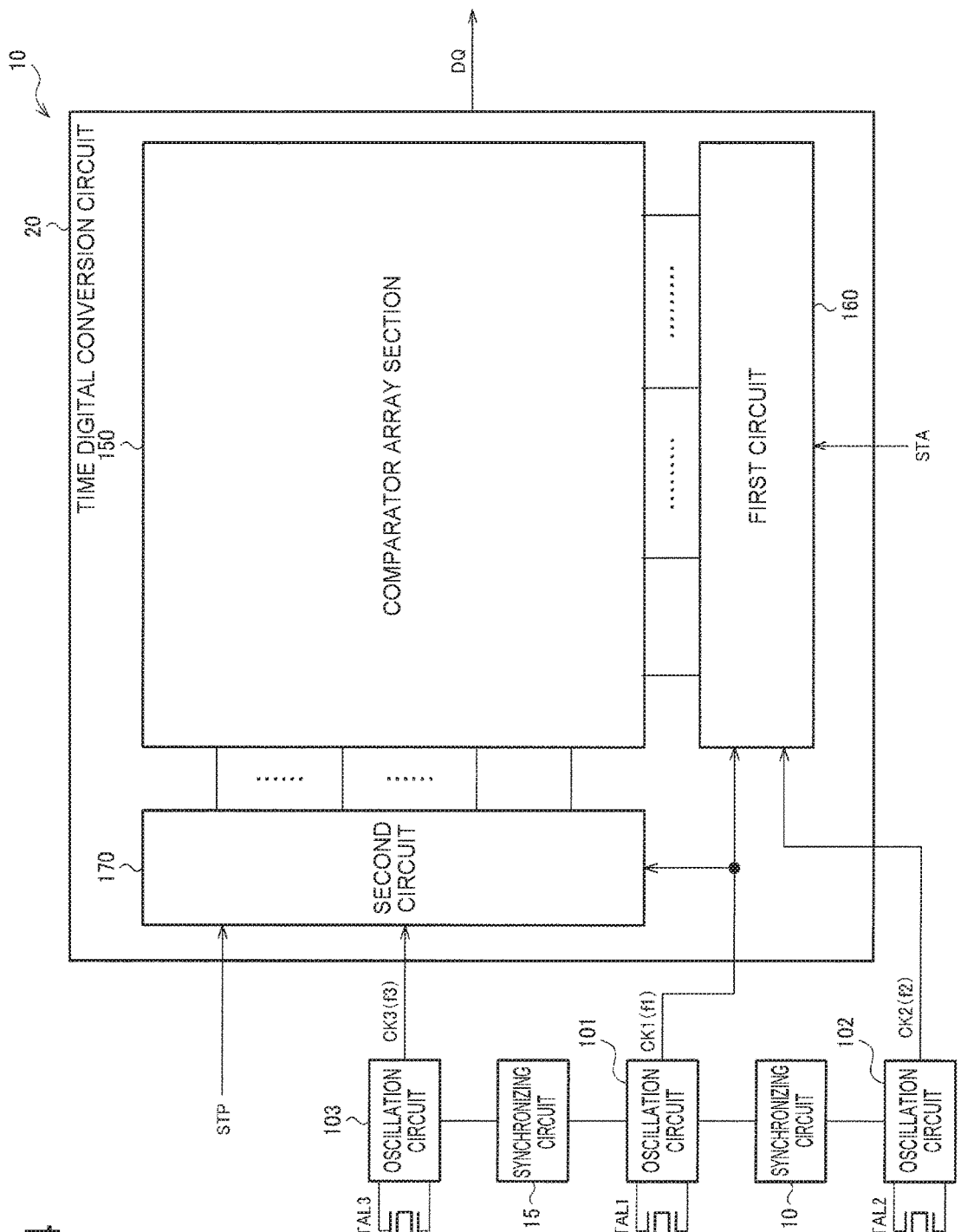
FIG. 4 is a diagram showing a detailed configuration example of the circuit device.

FIG. 4 shows a detailed configuration example of the circuit device 10. The circuit device 10 shown in FIG. 4 includes a time-to-digital conversion circuit 20, synchronizing circuits 110, 115, and oscillation circuits 101, 102, and 103. It should be noted that the configuration of the circuit device is not limited to the configuration shown in FIG. 4, but a variety of practical modifications such as elimination of some of the constituents (e.g., the synchronizing circuits 110, 115) or addition of other constituents are possible.

To the time-to-digital conversion circuit 20, there are input clock signals CK1, CK2, and CK3, and the time-to-digital conversion circuit 20 converts the time into a digital value based on the clock signals CK1, CK2, and CK3. In the example shown in FIG. 4, the time-to-digital conversion circuit 20 converts the time difference in the transition timing between the signal STA and the signal STP into the digital value DQ based on the clock signals CK1, CK2, and CK3 with the clock frequencies of f1, f2, and f3.

Specifically, the time-to-digital conversion circuit 20 converts the digital signals DQ11 through DQnm output by the comparator array section 150 into the digital value DQ. As described above, in the case in which the time difference between the signals STA, STP is TDF=Δtij, the time-to-digital conversion circuit 20 converts the digital signals DQ1 through DQn to output the digital value DQ corresponding to Δtij. Alternatively, in the case in which the resolution of the time-to-digital conversion is Δt, and Δtij=s×Δt (s is an integer equal to or greater than 1) is true, it is also possible for the time-to-digital conversion circuit 20 to output the value corresponding to s as the digital value DQ. It should be noted that it is also possible for the time-to-digital conversion circuit 20 to perform a filter process (a digital filter process, a low-pass filter process) of the digital value DQ, and output the digital value DQ on which the filter process has been performed.

Further, the time-to-digital conversion circuit 20 includes the comparator array section 150, the first circuit 160, and the second circuit 170. Further, to the first circuit 160, there are input the clock signals CK1, CK2, and the first DLL circuit 180 of the first circuit 160 sets the delay amounts of the delay elements using the frequency difference |f1−f2| between the clock signals CK1, CK2. To the second circuit 170, there are input the clock signals CK1, CK3, and the second DLL circuit 190 of the second circuit 170 sets the delay amounts of the delay elements using the frequency difference |f1−f3| between the clock signals CK1, CK3.

In other words, the first DLL circuit 180 has a plurality of delay elements, and the plurality of delay elements delays one of the clock signals CK1, CK2 to output a plurality of delayed clock signals. There is performed the phase comparison (the phase comparison of the transition of the signal level) between at least one delayed clock signal out of the plurality of delayed clock signals, and the other of the clock signals CK1, CK2, and thus, the adjustment of the delay amounts using the frequency difference |f1−f2| between the clock signals CK1, CK2 is realized. Regarding the second DLL circuit 190, the adjustment of the delay amounts using the frequency difference |f1−f3| between the clock signals CK1, CK3 is realized in substantially the same manner. It should be noted that the detailed adjustment method of the delay amounts will be described later.

By adopting this process, it becomes possible to adjust the delay amounts of the delay elements of the DLL circuits 180, 190 using the frequency differences |f1−f2|, |f1−f3| between the two clock signals, respectively. In other words, it becomes possible to adjust the delay amounts of the delay elements in the DLL circuit using the frequency difference instead of adjusting the total delay time in a lump so as to be equal to one cycle of the clock signal in the DLL circuit. Thus, it becomes possible to further reduce the influence of the variation due to the semiconductor process or the like in the delay elements, and it is possible to make the delay time of each of the phases of a multiphase clock signal (a delayed clock signal) generated by the DLL circuit high in accuracy. Further, by converting the time difference in transition timing between the signals STA, STP into the digital value DQ using the multiphase clock signal with the delay time high in accuracy, the high-performance time-to-digital conversion can be realized.

Further, in the present embodiment, the clock signal CK1 is a clock signal generated using a first resonator XTAL1. The clock signal CK2 is a clock signal generated using a second resonator XTAL2. The clock signal CK3 is a clock signal generated using a third resonator XTAL3.

Specifically, the oscillation circuits 101, 102, and 103 are circuits for oscillating the resonators XTAL1, XTAL2, and XTAL3. For example, the oscillation circuit 101 (a first oscillation circuit) oscillates the resonator XTAL1 to generate the clock signal CK1 with the clock frequency f1. The oscillation circuit 102 (a second oscillation circuit) oscillates the resonator XTAL2 to generate the clock signal CK2 with the clock frequency f2. The oscillation circuit 103 (a third oscillation circuit) oscillates the resonator XTAL3 to generate the clock signal CK3 with the clock frequency f3. The clock frequencies fulfill the relationship of f1>f3>f2.

The resonators XTAL1, XTAL2, and XTAL3 are each, for example, a piezoelectric resonator. Specifically, the resonators XTAL1, XTAL2, and XTAL3 are each, for example, a quartz crystal resonator. The resonators XTAL1, XTAL2, and XTAL3 are each a thickness-shear vibration type quartz crystal resonator such as an AT-cut type or an SC-cut type. For example, the resonators XTAL1, XTAL2, and XTAL3 can also be a resonator of a simple-package type (SPXO), an oven type (OCXO) provided with a thermostatic oven, or can also be a resonator of a temperature compensation type (TCXO) not provided with the thermostatic oven. Further, as the resonators XTAL1, XTAL2, and XTAL3, it is also possible to adopt a surface acoustic wave (SAW) resonator, an MEMS (micro electromechanical systems) resonator as a resonator made of silicon, and so on.

By using the clock signal generated by the resonator as described above, it is possible to obtain the oscillation frequency high in accuracy compared to the method not using the resonator, and make the delay amounts of the delay elements high in accuracy. In other words, in the time-to-digital conversion, since the delay time of the delayed clock signal generated by the DLL circuit becomes high in accuracy, it is possible to achieve an improvement in accuracy of the time-to-digital conversion compared to the method not using the resonator.

The synchronizing circuit 110 performs phase synchronization between the clock signal CK1 and the clock signal CK2. For example, the synchronizing circuit 110 phase-synchronizes the clock signals CK1, CK2 with each other at every phase synchronization timing (every given timing). Specifically, the synchronizing circuit 110 performs the phase synchronization for making the transition timings of the clock signals CK1, CK2 coincide with each other at every phase synchronization timing. Similarly, the synchronizing circuit 115 performs phase synchronization between the clock signal CK1 and the clock signal CK3. For example, the synchronizing circuit 115 phase-synchronizes the clock signals CK1, CK3 with each other at every phase synchronization timing (every given timing). Specifically, the synchronizing circuit 115 performs the phase synchronization for making the transition timings of the clock signals CK1, CK3 coincide with each other at every phase synchronization timing.

It should be noted that although the explanation will hereinafter be presented citing the synchronizing circuit 110 as an example, the synchronizing circuit 115 can also similarly be configured.

The synchronizing circuit 110 is, for example, a PLL circuit. The PLL circuit includes a phase comparison circuit and a charge pump circuit. Further, the phase comparison circuit performs the phase comparison between a reference clock signal obtained by frequency-dividing the clock frequency f2 of the clock signal CK2 by M, and a clock signal obtained by frequency-dividing the clock frequency f1 of the clock signal CK1 by N. The charge pump circuit outputs a control voltage based on the phase comparison result. The oscillation circuit 101 is, for example, a voltage-controlled crystal oscillator (VCXO), and oscillates the resonator XTAL1 with the oscillation frequency corresponding to the control voltage.

Alternatively, the synchronizing circuit 110 can also be a circuit for electrically connecting the oscillation loop of the oscillation circuit 101 and the oscillation loop of the oscillation circuit 102 to each other at every phase synchronization timing (the timing at which the phases of the oscillation signals roughly coincide with each other) between the oscillation signal in the oscillation circuit 101 and the oscillation signal in the oscillation circuit 102. This circuit includes a counter and a switch circuit. The counter performs a counting operation based on one of the clock signals CK1, CK2. The switch circuit is a switch circuit for connecting the oscillation loop of the oscillation circuit 101 and the oscillation loop of the oscillation circuit 102 to each other. For example, in the case in which the counter counts the clock signal CK1, the synchronizing circuit 110 sets the switch circuit to the ON state every time the count value reaches a given preset value, and performs the phase synchronization.

3. Adjustment Method of Delay Amount of DLL Circuit

The adjustment method of the delay amounts of the delay elements in the DLL circuits 180, 190 will hereinafter be described.

Figure 5:
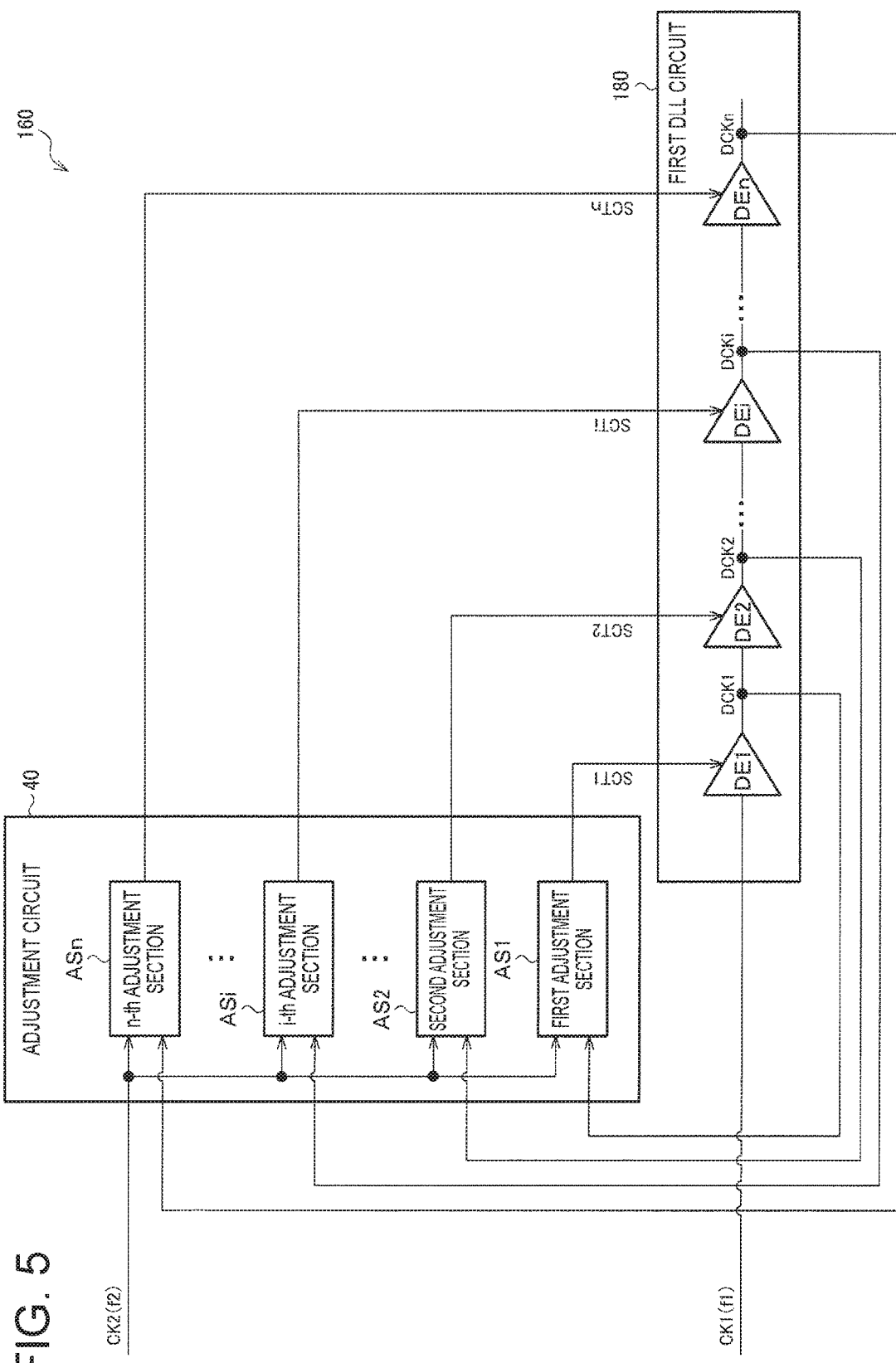
FIG. 5 is a diagram showing a first detailed configuration example of a first circuit.

FIG. 5 shows a first detailed configuration example of the first circuit 160. The first circuit 160 includes the DLL circuit 180 and an adjustment circuit 40. It should be noted that FIG. 5 shows a configuration for performing an adjustment of the delay amounts. The configuration of delaying the signals STA, STP will be described later. Further, although the explanation will be presented citing the first circuit 160 (the first DLL circuit 180) as an example, the same also applies to the second circuit 170 (the second DLL circuit 190). Specifically, it is sufficient to replace the clock signal CK2 with the clock signal CK3, the clock frequency f2 with the clock frequency f3, the number n with the number m, and Δta with Δtb.

The DLL circuit 180 has first through n-th delay elements DE1 through DEn (the plurality of delay elements), and the first clock signal CK1 with the first clock frequency f1 is input to the DLL circuit 180. The reference symbol n denotes an integer equal to or greater than 3. The clock signal CK1 is input to the first delay element DE1, and the first through n-th delay elements DE1 through DEn sequentially delay the clock signal CK1 to output the first through n-th delayed clock signals DCK1 through DCKn.

To the adjustment circuit 40 (a first adjustment circuit), there are input the delayed clock signals from the delay elements of the DLL circuit 180, and the second clock signal CK2 with the second clock frequency f2. The second clock frequency f2 is lower than the first clock frequency f1. The adjustment circuit 40 adjusts the delay amounts of the delay elements of the DLL circuit 180 using the frequency difference |f1−f2| between the first clock frequency f1 and the second clock frequency f2.

Therefore, to the adjustment circuit 40, there is input at least one delayed clock signal as the delayed clock signal from the delay element out of the delayed clock signals DCK1 through DCKn. It should be noted that although FIG. 5 shows the case in which all of the delayed clock signals DCK1 through DCKn are input to the adjustment circuit 40, this is not a limitation, but it is sufficient that any one or a plurality of delayed clock signals out of the delayed clock signals DCK1 through DCKn is input to the adjustment circuit 40. For example, in the case in which the i-th delayed clock signal DCKi is input to the adjustment circuit 40, the adjustment circuit 40 adjusts the delay amounts of the delay elements based on the delayed clock signal DCKi and the clock signal CK2. For example, the adjustment circuit 40 adjusts the delay amount of at least one of the delay elements DE1 through DEi to thereby adjust the delay time of the delayed clock signal DCKi. The reference symbol i denotes an integer no smaller than 1 and no greater than n.

Figure 6:
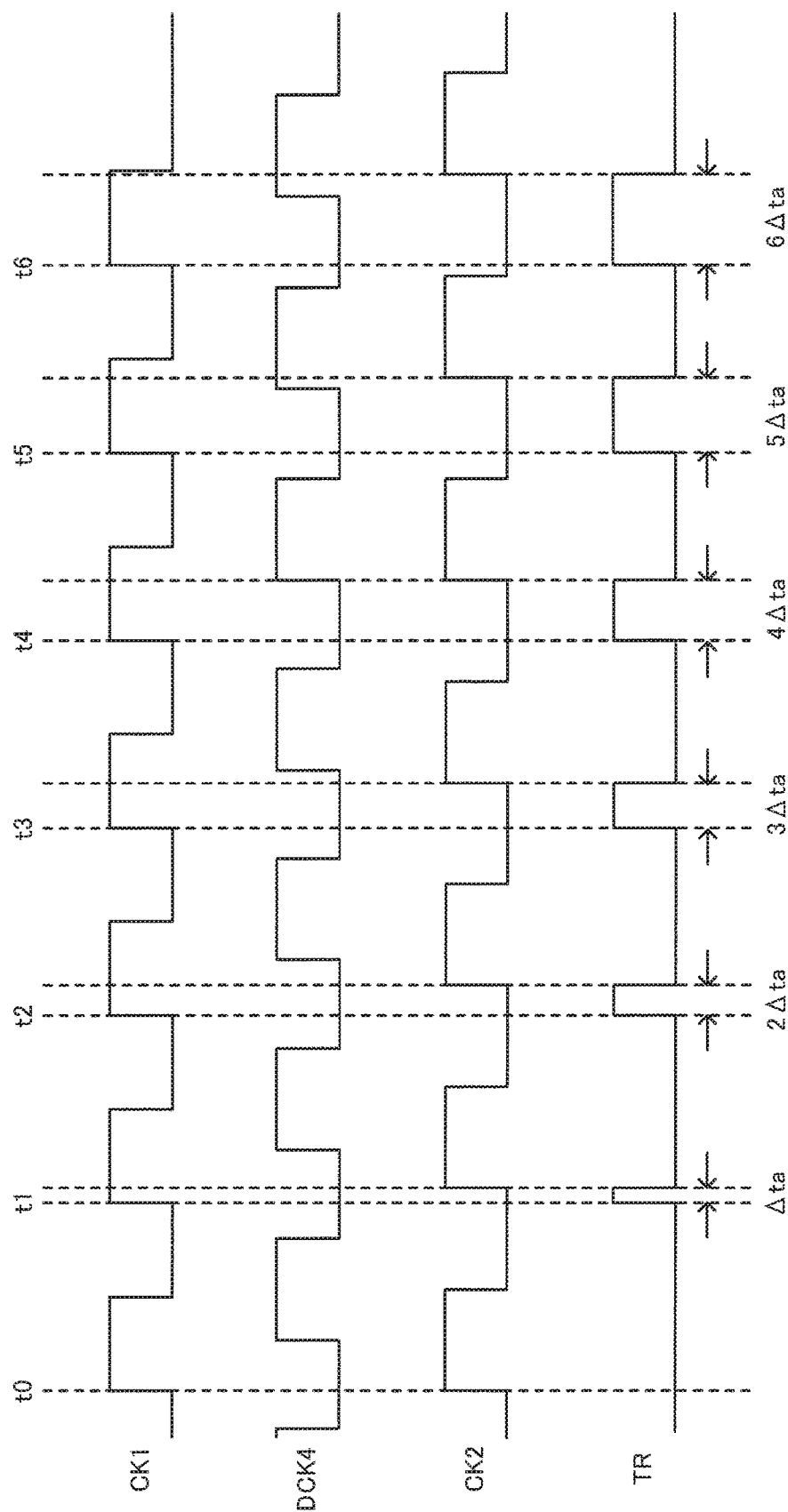
FIG. 6 is a diagram for explaining an adjustment method of a delay amount using a clock frequency difference.

FIG. 6 is a diagram for explaining an adjustment method of a delay amount using a clock frequency difference. At t0, the clock signals CK1, CK2 coincide in the transition timing (the timing at which the logic level of the signal changes, the phase) with each other. Subsequently, at t1, t2, t3, . . . , an inter-clock time difference TR (phase difference), which is a time difference in the transition timing between the clock signals CK1, CK2, increases monotonically like Δta, 2Δta, 3Δta, . . . . In FIG. 6, the inter-clock time difference is represented by a pulse signal with a width of TR.

Further, in the adjustment of the delay amounts of the present embodiment, there is used, for example, a plurality of resonators to adjust the delay time of the delayed clock signals using the clock frequency difference. Specifically, in the case of defining the clock frequencies of the clock signals CK1, CK2 respectively as f1, f2, the adjustment circuit 40 adjusts the delay time of the delayed clock signals so that the delay time in the delay element in each stage becomes the delay time corresponding to the frequency difference |f1−f2| between the clock frequencies f1, f2. For example, as shown in FIG. 6, the adjustment circuit 40 adjusts the delay time of the delayed clock signals using the principle of a vernier caliper.

It should be noted that the second circuit 170 includes a second adjustment circuit. Further, to the second adjustment circuit, there are input the delayed clock signals from the delay elements of the second DLL circuit 190, and the third clock signal CK3 with the third clock frequency f3 which is lower (and higher than f2) than the first clock frequency f1. The second adjustment circuit adjusts the delay amounts of the delay elements of the second DLL circuit 190 using the frequency difference |f1−f3| between the first clock frequency f1 and the third clock frequency f3.

As described above, since the delayed clock signals obtained by delaying the clock signal CK1 with the DLL circuit 180, and the clock signal CK2 are input to the adjustment circuit 40, it becomes possible to perform the adjustment of the delay amounts using the difference in frequency |f1−f2| between the clock signals CK1, CK2 based on the delayed clock signals and the clock signal CK2. Since the delay amount in each of the delay elements is adjusted with the frequency difference |f1−f2|, it becomes possible to reduce the influence of the variation due to the semiconductor process and so on in the delay elements. Further, since the delay amount in each of the delay elements are adjusted with the frequency difference |f1−f2|, it becomes possible to set the resolution of the digital conversion using the frequency difference |f1−f2| between the clock frequencies f1, f2. Further, since the influence of the variation due to the semiconductor process and so on is reduced, an improvement and so on of the performance such as the accuracy or the resolution of the time-to-digital conversion becomes possible.

Specifically, the adjustment circuit 40 adjusts the delay amounts of the plurality of delay elements of the DLL circuit 180 using the time difference in transition timing between the first clock signal CK1 and the second clock signal CK2.

Specifically, since the inter-clock time difference TR, which is the time difference in transition timing between the clock signals CK1, CK2, increases by Δta like Δta, 2Δta, 3Δta, . . . , it becomes possible to adjust the delay amounts using the inter-clock time difference TR so that the delay time in the delay element in each stage becomes Δta. This delay amount Δta can be expressed as follows: $\Delta ta = |1/f1 - 1/f2| = |f1-f2|/(f1 \times f2)$, and is the delay amount corresponding to the frequency difference |f1−f2|. It should be noted that the delay amount Δtb in the second DLL circuit 190 is as follows: $\Delta tb = |1/f1 - 1/f3| = |f1-f2|/(f1 \times f3)$.

Further, the adjustment circuit 40 adjusts the delay amount of the i-th delay element DEi of the plurality of delay elements using the transition of the signal level at the i-th transition timing (ti+i×Δta) of the second clock signal CK2 after the phase synchronization timing (t0) between the first clock signal CK1 and the second clock signal CK2.

Further, the adjustment circuit 40 adjusts the delay amount of the j-th delay element DEj of the plurality of delay elements using the transition of the signal level at the j-th transition timing (tj+j×Δta) after the i-th transition timing of the second clock signal CK2. The reference symbol j fulfills j>i, and denotes an integer equal to or smaller than n.

Therefore, the adjustment circuit 40 adjusts the delay amount of the delay element DEi based on the phase difference between the i-th transition timing of the second clock signal CK2 and the transition timing of the i-th delayed clock signal DCKi. Specifically, the adjustment circuit 40 performs the adjustment so that the transition timings coincide with each other (the phase difference becomes zero). Similarly, the adjustment circuit 40 adjusts the delay amount of the delay element DEj based on the phase difference between the j-th transition timing of the second clock signal CK2 and the transition timing of the j-th delayed clock signal DCKj. Here, the transition of the signal level denotes that the clock signal makes the transition from a first logic level to a second logic level, or the clock signal makes the transition from the second logic level to the first logic level. It should be noted that in FIG. 6, there is illustrated the case of adjusting the delay amount using the transition from the low level to the high level in the clock signal CK2.

By adjusting the delay amounts of the i-th and j-th delay elements DEi, DEj using the transitions of the signal level at the i-th and j-th transition timings of the second clock CK2 as described above, it become possible to adjust the delay amount using the frequency difference |f1−f2| between the clock frequencies f1, f2. Specifically, since the time difference in transition timing between the clock signals CK1, CK2 increases by Δta at every transition timing, by adjusting the delay amounts of the i-th and j-th delay elements DEi, DEj using the transition of the signal level at the i-th and j-th transition timings, it is possible to perform the adjustment so that the delay amount in each of the delay elements up to the i-th and j-th delay elements DEi, DEj becomes 0ta. Further, by performing the adjustment using the transition of the signal level at a plurality of transition timings, the number of delayed clock signals, the delay time of which is adjusted by feedback, out of the plurality of delayed clock signals increases, and thus, the delayed clock signals, which are more accurate (in which the influence of the variation due to the semiconductor process and so on is reduced), can be obtained.

Here, the phase synchronization timing is the timing at which the transition timings (the phases) of the clock signals CK1, CK2 coincide (or roughly coincide) with each other. For example, in the case in which the clock signals CK1, CK2 are synchronized with each other by the synchronizing circuit (the synchronizing circuit 110 shown in FIG. 4) or the like, the synchronization timing (the timing for the phase comparator to perform the phase comparison) of the synchronizing circuit or the like corresponds to the phase synchronization timing described above. It should be noted that it is not required for the clock signals CK1, CK2 to be synchronized with each other by the synchronizing circuit. In this case, the phase synchronization timing is the timing at which, for example, the phase comparator compares the phases of the clock signals CK1, CK2 with each other, and determines that the phases coincide with each other (the anteroposterior relationship in phase between the clock signals CK1, CK2 is reversed).

Further, in the case of defining the time difference corresponding to the frequency difference |f1−f2| as Δta, the adjustment circuit 40 adjusts the delay amount due to the first through i-th delay elements DE1 through DEi of the plurality of delay elements to the delay amount corresponding to i×Δta.

For example, FIG. 6 shows the case of i=4. In this example, the adjustment circuit 40 adjusts the delay amount so that the transition timing of the delayed clock signal DCK4 coincides with the fourth transition timing of the clock signal CK2. Since the delayed clock signal DCK4 is obtained by delaying the clock signal CK1 with the delay elements DE1 through DE4, the delay time of the delayed clock signal DCK4 with respect to the clock signal CK1 is 4Δta. In such a manner, the delay amount due to the delay elements DE1 through DE4 is adjusted to the delay amount corresponding to 4Δta.

In the past, the delay amount due to the delay elements DE1 through DEn is just adjusted to one cycle of the clock signal, and therefore, the delay amount due to the delay elements DE1 through DEi located in between cannot be adjusted. In this regard, in the present embodiment, it is possible to adjust the delay amount due to the delay elements DE1 through DEi located in between. Further, the delay amount is not necessarily limited to one cycle of the clock signal, but it is possible to lock the DLL circuit with a delay amount (i×Δta) other than one cycle of the clock signal using the difference in frequency |f1−f2| between the two clock signals CK1, CK2.

More specifically, as shown in FIG. 5, the adjustment circuit 40 includes first through n-th adjustment sections AS1 through ASn.

The i-th adjustment section ASi compares the transition timing of the delayed clock signal DCKi and the i-th transition timing of the clock signal CK2 with each other, and outputs the control signal SCTi based on the comparison result. The control signal SCTi is a signal for controlling the delay amount of the delay element DEi. In the case in which the transition timing of the delayed clock signal DCKi leads the i-th transition timing of the clock signal CK2, the delay amount of the delay element DEi is increased. In contrast, in the case in which the transition timing of the delayed clock signal DCKi lags the i-th transition timing of the clock signal CK2, the delay amount of the delay element DEi is decreased.

It should be noted that in the case of performing feedback based only on some of the delayed clock signals DCK1 through DCKn, it is sufficient to dispose only the adjustment sections corresponding to those delayed clock signals. For example, in the case of inputting only the delayed clock signals DCKp, DCKn (the reference symbol p is an integer no smaller than one and no greater than n−1, and fulfills p≠q) to the adjustment circuit 40, it is sufficient for the adjustment circuit 40 to include only the adjustment sections ASp, ASn. In this case, it is sufficient to input the control signal SCTp to the delay elements DE1 through DEp, and input the control signal SCTn to the delay elements DEp+1 through DEn.

In the present embodiment described hereinabove, the first clock signal CK1 is input to the DLL circuit 180, and the DLL circuit 180 outputs the plurality of delayed clock signals (DCK1 through DCKn) generated by delaying the first clock signal CK1 with the plurality of delay elements (DE1 through DEn). Then, the adjustment circuit 40 performs the phase comparison between the delayed clock signal (at least one of the delayed clock signals DCK1 through DCKn) and the second clock signal CK2, and then adjusts the delay amounts of the delay elements of the DLL circuit 180 based on the result of the phase comparison.

According to the present embodiment, since the phase comparison is performed between the clock signal CK1 delayed by the plurality of delay elements and the clock signal CK2, there is realized the adjustment of the delay amounts using the difference in frequency |f1−f2| between the clock signals CK1, CK2 described with reference to FIG. 6. Specifically, since the time difference in transition timing between the clock signals CK1, CK2 increases in such a manner as Δta, 2Δta, 3Δta, . . . , by aligning the phase of the delayed clock signal with the clock signal CK2 as the lagged clock signal, the delay amounts of the signals having passed through the delay elements DE1, DE2, DE3, . . . are obtained as Δta, 2Δta, 3Δta, . . . .

Further, in the present embodiment, the adjustment circuit 40 is a circuit device characterized in that in the case of assuming the number of delay elements in the DLL circuit 180 as n, the delay amounts of them delay elements are adjusted. The reference symbol m denotes an integer no smaller than 1 and no greater than n. It should be noted that m is desirably equal to or greater than 2.

As described above, in the present embodiment, it is possible to adjust the delay amounts of an arbitrary number (m) of delay elements out of the plurality of delay elements in the DLL circuit 180. The more the number of delay elements adjusted in the delay amount is increased, the more difficult it becomes to be affected by the variation due to the semiconductor process and so on, and thus, the accuracy of the delay time of the delayed clock signals can be increased. On the other hand, the more the number of the delay elements adjusted in the delay amount is decreased, the more the circuit scale of the adjustment circuit 40 can be reduced. Therefore, it is possible to set the number of the delay elements adjusted in the delay amount in accordance with the desired accuracy and the circuit scale. For example, it is also possible to adjust the delay amounts of every predetermined number of delay elements out of the plurality of delay elements.

4. Delay Elements

A detailed configuration example of the delay elements in the DLL circuits 180, 190 will hereinafter be described. It should be noted that although the explanation will hereinafter be presented citing the i-th delay element DEi of the DLL circuit 180 as an example, the same applies to the delay elements in the DLL circuit 190.

In the DLL circuit 180, there is disposed at least one of a variable capacitor and a variable current source in accordance with the delay element DEi. Further, the adjustment circuit 40 adjusts at least one of the capacitance value of the variable capacitor and the current value of the variable current source.

Specifically, the variable capacitor is a capacitor for making the load capacitance of the delay element DEi variable. The variable current source is a current source for making the current for setting the drive capacity of the delay element DEi variable. The adjustment circuit 40 controls (adjusts) the capacitance value, the current value, or the capacitance value and the current value with the control signal SCTi. Thus, the adjustment of the delay amount (the delay time of the delayed clock signal DCKi) of the delay element DEi is realized.

It should be noted that although there are hereinafter described the case of adjusting the capacitance value of the variable capacitor, and the case of adjusting the current value of the variable current source, it is also possible to adjust both of the capacitance value and the current value by appropriately combining these cases with each other.

Figure 7:
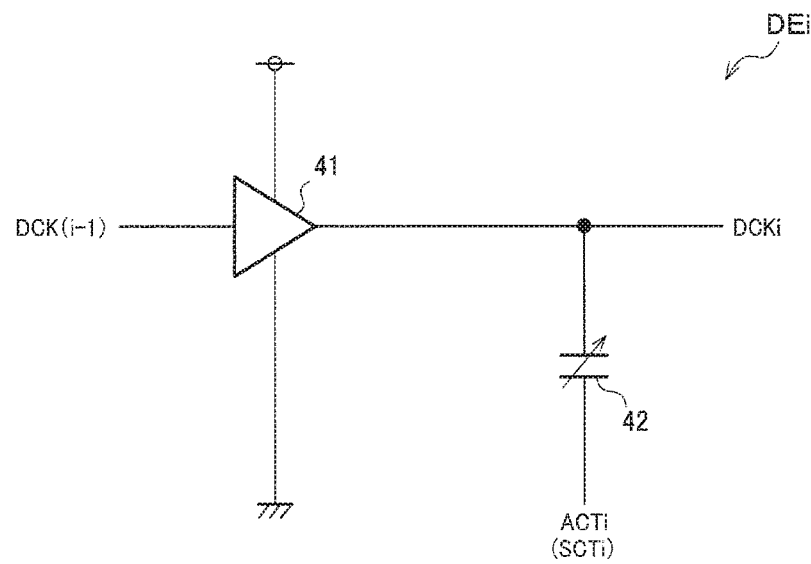
FIG. 7 is a diagram showing a first detailed configuration example of a delay element.

Firstly, the case of adjusting the capacitance value of the variable capacitor will be described. FIG. 7 shows a first detailed configuration example of the delay element DEi. The delay element DEi shown in FIG. 7 includes a buffer circuit 41, and a varactor 42 (a variable capacitance diode).

The buffer circuit 41 buffers the delayed clock signal DCK(i−1), and outputs the delayed clock signal DCKi. The buffer circuit 41 is a circuit for buffering and then outputting a signal having the same logic level as the input logic level, and is formed of, for example, two stages of inverters, or comparators (amplifier circuits).

One end of the varactor 42 is connected to an output node of the buffer circuit 41, and the control voltage ACTi is input to the other end. In the case in which the adjustment section ASi outputs an analog control signal SCTi, the control voltage ACTi corresponds to the analog control signal SCTi. By the adjustment section ASi varying the control voltage ACTi, the capacitance value of the varactor 42 varies, and thus, the delay time in the buffer circuit 41 varies.

Figure 8:
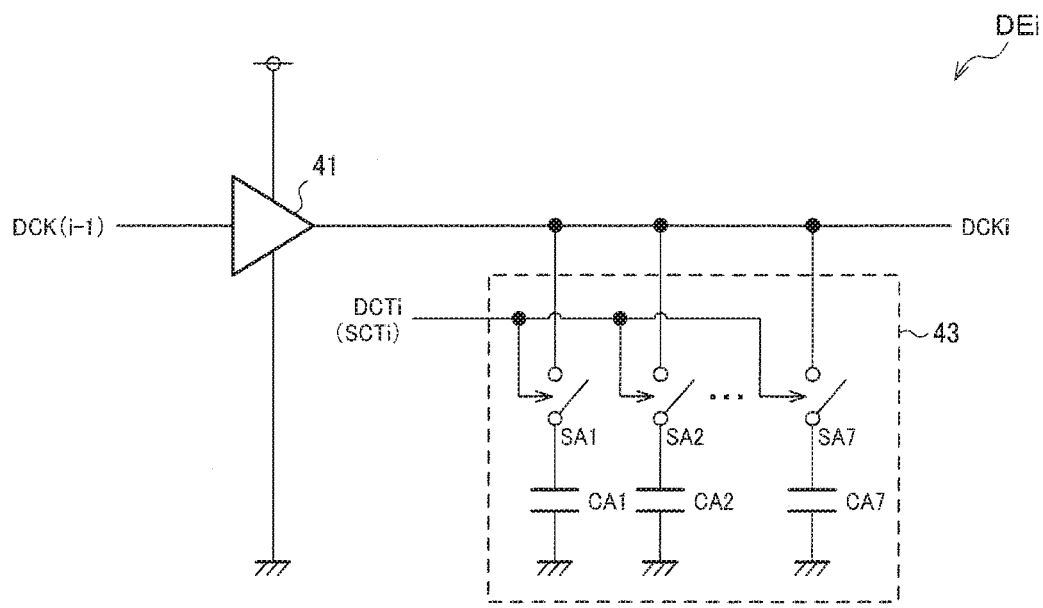
FIG. 8 is a diagram showing a second detailed configuration example of the delay element.

FIG. 8 shows a second detailed configuration example of the delay element DEi. The delay element DEi shown in FIG. 8 includes a buffer circuit 41, and a capacitor circuit 43.

The capacitor circuit 43 includes switches SA1 through SA7, one ends of which are connected to the output node of the buffer circuit 41, and capacitors CA1 through CA7, one ends of which are connected respectively to the other ends of the switches SA1 through SA7. The other ends of the capacitors CA1 through CA7 are connected to, for example, a low potential side power supply node. The switches SA1 through SA7 are each, for example, a transistor. The switches SA1 through SA7 are each controlled by the control data DCTi to be set to the ON state or the OFF state. In the case in which the adjustment section ASi outputs a digital control signal SCTi, the control data DCTi corresponds to the digital control signal SCTi. By the adjustment section ASi changing the control data DCTi, the capacitors to be connected to the output node of the buffer circuit 41 out of the capacitors CA1 through CA7 are changed, and thus the delay time in the buffer circuit 41 varies. It should be noted that the number of the switches and the capacitors provided to the capacitor circuit 43 is not limited to 7.

Figure 9:
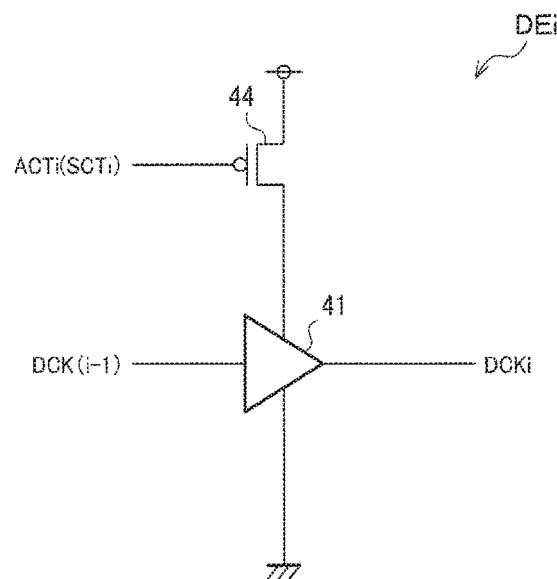
FIG. 9 is a diagram showing a third detailed configuration example of the delay element.

Then, the case of adjusting the current value of the variable current source will be described. FIG. 9 shows a third detailed configuration example of the delay element DEi. The delay element DEi shown in FIG. 9 includes the buffer circuit 41, and a transistor 44.

The transistor 44 is disposed between a high potential side power supply node of the buffer circuit 41 and the high potential side power supply. The transistor 44 is, for example, a P-type transistor (a first conductivity type transistor). The control voltage ACTi is input to the gate of the transistor 44. By the adjustment section ASi varying the control voltage ACTi, the drain current of the transistor 44 varies, and thus, the delay time (the delay time when DCKi makes the transition from the low level to the high level) in the buffer circuit 41 varies. It should be noted that it is also possible to insert the transistor (an N-type transistor (a second conductivity type transistor)) in the low potential side power supply instead of the high potential side power supply. Alternatively, it is also possible to insert the transistors to both of the high potential side power supply and the low potential side power supply.

Figure 10:
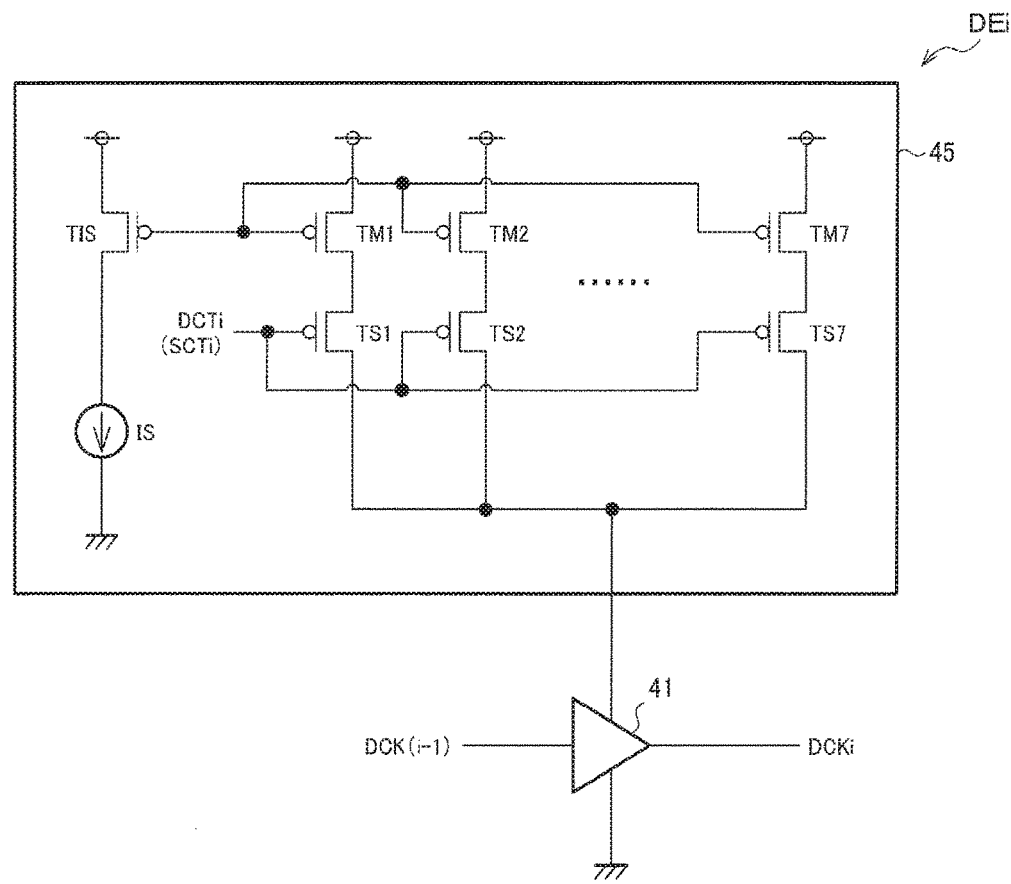
FIG. 10 is a diagram showing a fourth detailed configuration example of the delay element.

FIG. 10 shows a fourth detailed configuration example of the delay element DEi. The delay element DEi shown in FIG. 10 includes the buffer circuit 41, and a current mirror circuit 45.

The current mirror circuit 45 includes a current source IS, a transistor TIS, mirroring transistors TM1 through TM7, and switching transistors TS1 through TS7, and is disposed between the high potential side power supply node of the buffer circuit 41 and the high potential side power supply. The transistors TIS, TM1 through TM7, and TS1 through TS7 are each a P-type transistor (the first conductivity type transistor). The bias current supplied from the current source IS is mirrored by the transistors TM1 through TM7 via the transistor TIS. The transistors TS1 through TS7 are disposed between the transistors TM1 through TM7, and the high potential side power supply node, respectively, and are each controlled by the control data DCTi to be set to the ON state or the OFF state. By the adjustment section ASi changing the control data DCTi, the transistors to be connected to the high potential side power supply node of the buffer circuit 41 out of the transistors TM1 through TM7 are changed, and thus the delay time in the buffer circuit 41 varies. It should be noted that the number of the mirroring transistors and the switching transistors provided to the current mirror circuit 45 is not limited to 7. Further, it is also possible to insert the current mirror circuit to the low potential side power supply instead of the high potential side power supply. Alternatively, it is also possible to insert the current mirror circuits to both of the high potential side power supply and the low potential side power supply.

5. Adjustment Circuit

A detailed configuration example of the adjustment circuit 40 will hereinafter be described. It should be noted that although the description will hereinafter be presented citing the adjustment section ASi of the adjustment circuit 40 as an example, the same applies to the adjustment sections of the second adjustment circuit of the second circuit 170.

Figure 11:
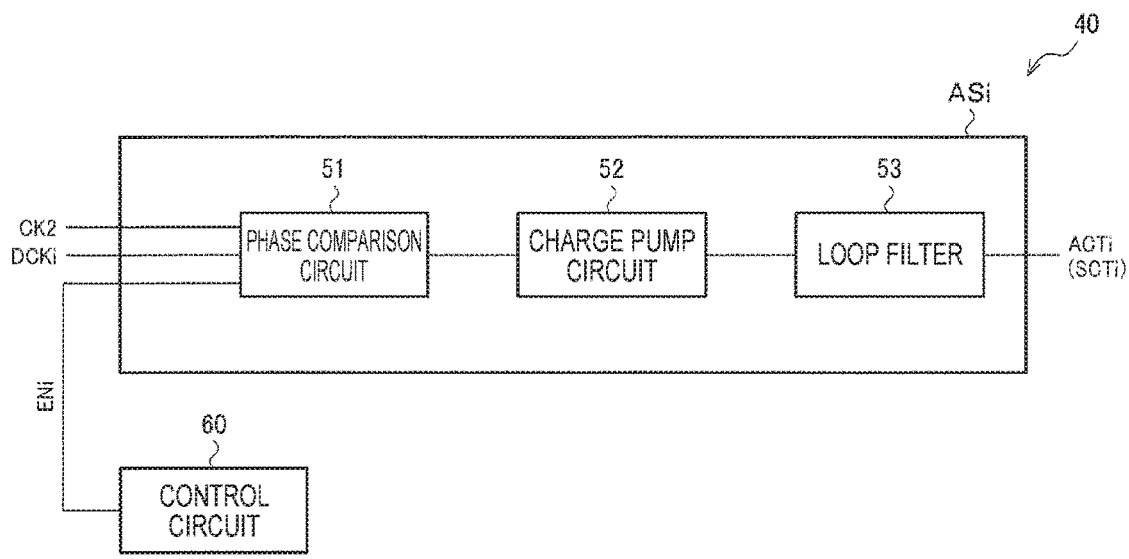
FIG. 11 is a diagram showing a first detailed configuration example of an adjustment circuit.

FIG. 11 shows a first detailed configuration example of the adjustment circuit 40. The adjustment circuit 40 includes the adjustment section ASi and a control circuit 60. The adjustment section ASi includes a phase comparison circuit 51, a charge pump circuit 52, and a loop filter 53. It should be noted that the control circuit 60 can also be disposed outside the adjustment circuit 40.

The control circuit 60 outputs an enable signal ENi which becomes active during the period including the i-th transition timing of the clock signal CK2. For example, the length of the period is one cycle of the clock signal CK2. For example, citing the case of i=4 in FIG. 6 as an example, the timing at which the clock signal CK2 rises at t4+4Δta corresponds to the fourth transition timing. For example, the enable signal EN4 becomes active in the period between the falling edges of the clock signal CK2 before and after the fourth transition timing.

In the case in which the enable signal ENi is active, the phase comparison circuit 51 compares the phases of the clock signal CK2 and the delayed clock signal DCKi with each other, and then outputs the comparison result to the charge pump circuit 52. For example, the phase comparison circuit 51 outputs an up signal or a down signal in accordance with the phase difference between the clock signal CK2 and the delayed clock signal DCKi. The charge pump circuit 52 outputs a current pulse based on the comparison result from the phase comparison circuit 51. For example, the charge pump circuit 52 converts the up signal and the down signal into the current pulse. The loop filter 53 smoothes, and at the same time voltage-converts, the current pulses from the charge pump circuit 52, and then outputs the control voltage ACTi.

Figure 12:
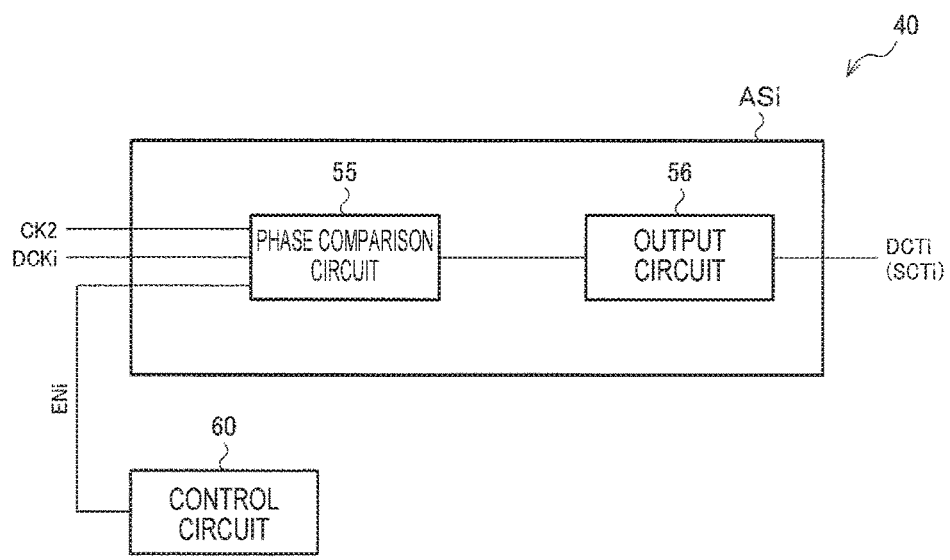
FIG. 12 is a diagram showing a second detailed configuration example of the adjustment circuit.

FIG. 12 shows a second detailed configuration example of the adjustment circuit 40. The adjustment circuit 40 includes the adjustment section ASi and the control circuit 60. The adjustment section ASi includes a phase comparison circuit 55 and an output circuit 56.

In the case in which the enable signal ENi is active, the phase comparison circuit 55 compares the phases of the clock signal CK2 and the delayed clock signal DCKi with each other, and then outputs the comparison result to the output circuit 56. For example, similarly to the phase comparison circuit 51 shown in FIG. 11, the phase comparison circuit 55 outputs the up signal or the down signal in accordance with the phase difference. The output circuit 56 outputs the control data DCTi based on the comparison result from the phase comparison circuit 55. For example, the output circuit 56 increases the value of the control data DCTi in the case in which the up signal is input, and decreases the value of the control data DCTi in the case in which the down signal is input. For example, it is possible to increase or decrease the control data DCTi as much as a predetermined value (e.g., "1"), or the value to be added or subtracted can be varied in accordance with the pulse width of the up signal or the down signal.

6. Method of Generating Delay Signals

The method of the first and second circuits 160, 170 for generating the delayed signals DKA1 through DKAn, and DKB1 through DKBm using the DLL circuits 180, 190 will hereinafter be described.

Figure 13:
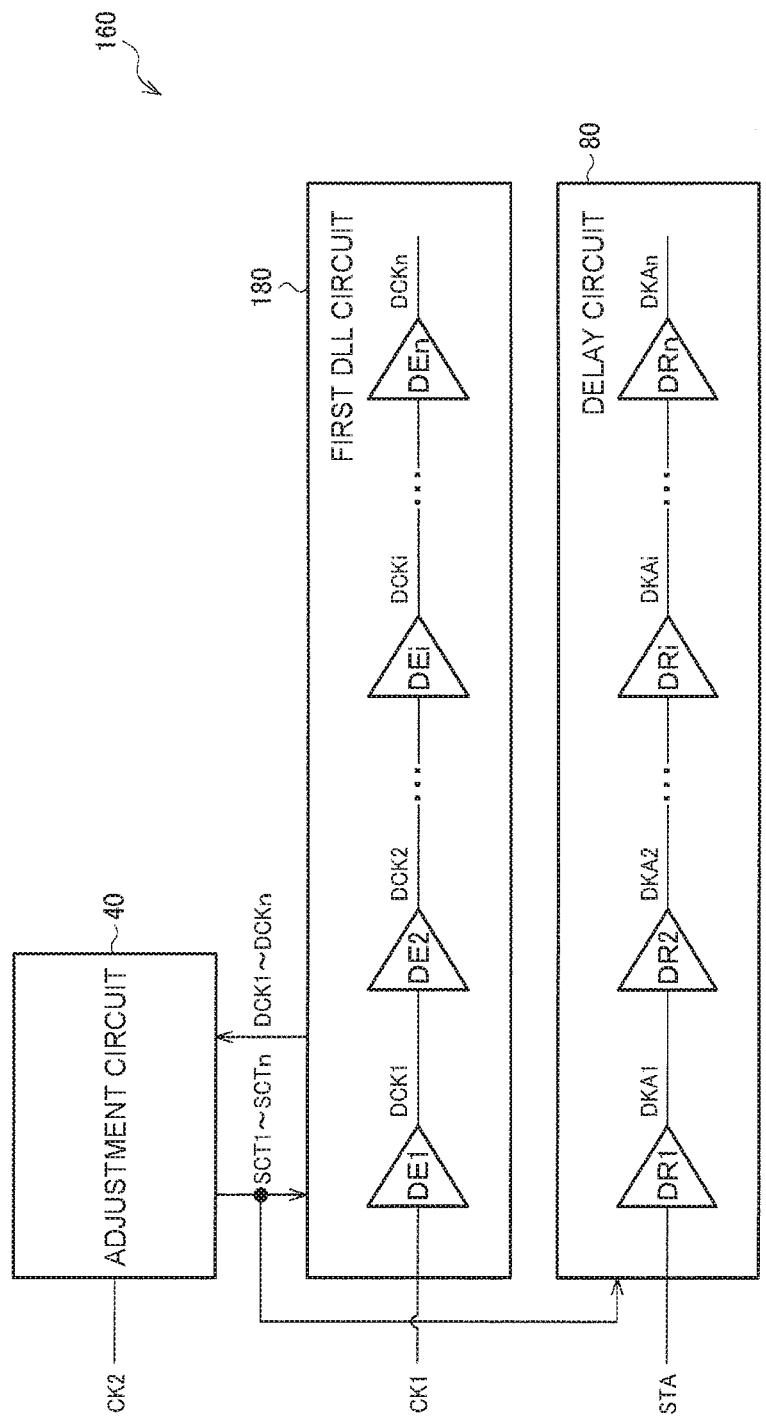
FIG. 13 is a diagram showing a second detailed configuration example of the first circuit.

FIG. 13 shows a second detailed configuration example of the first circuit 160. The first circuit 160 shown in FIG. 13 includes the DLL circuit 180, the adjustment circuit 40, and a delay circuit 80 (a first delay circuit). The DLL circuit 180 and the adjustment circuit 40 are the same as the DLL circuit 180 and the adjustment circuit 40 described with reference to FIG. 5. It should be noted that although the description will hereinafter be presented citing the first circuit 160 as an example, the same also applies to the second circuit 170. Specifically, it is sufficient to replace the clock signal CK2 with the clock signal CK3, the clock frequency f2 with the clock frequency f3, the signal STA with the signal STP, the number n with the number m, and the delayed signals DKA1 through DKAn with the delayed signals DKB1 through DKBm.

The delay circuit 80 delays the first signal STA with the delay amount corresponding to the signal delay in the first DLL circuit 180, and then outputs the first delayed signal group (DKA1 through DKAn) to the comparator array section 150.

Specifically, the delay circuit 80 is a replica circuit of the DLL circuit 180. The delay circuit 80 has first through n-th delay elements DR1 through DRn having the same configuration as the delay elements DE1 through DEn of the DLL circuit 180. Further, the control signals SCT1 through SCTn from the adjustment circuit 40 are input to the delay elements DR1 through DRn, and the delay amounts of the delay elements DR1 through DRn are controlled (adjusted) by the control signals SCT1 through SCTn. The signal STA is input to the delay element DR1, and the signal STA is sequentially delayed by the delay elements DR1 through DRn, and thus, the first through n-th delayed signals DKA1 through DKAn are output.

It should be noted that the second circuit 170 includes a second delay circuit. Further, the second delay circuit delays the second signal STP with the delay amount corresponding to the signal delay in the second DLL circuit 190, and then outputs the second delayed signal group (DKB1 through DKBm) to the comparator array section 150. The second delay circuit is a replica circuit of the second DLL circuit 190.

Figure 14:
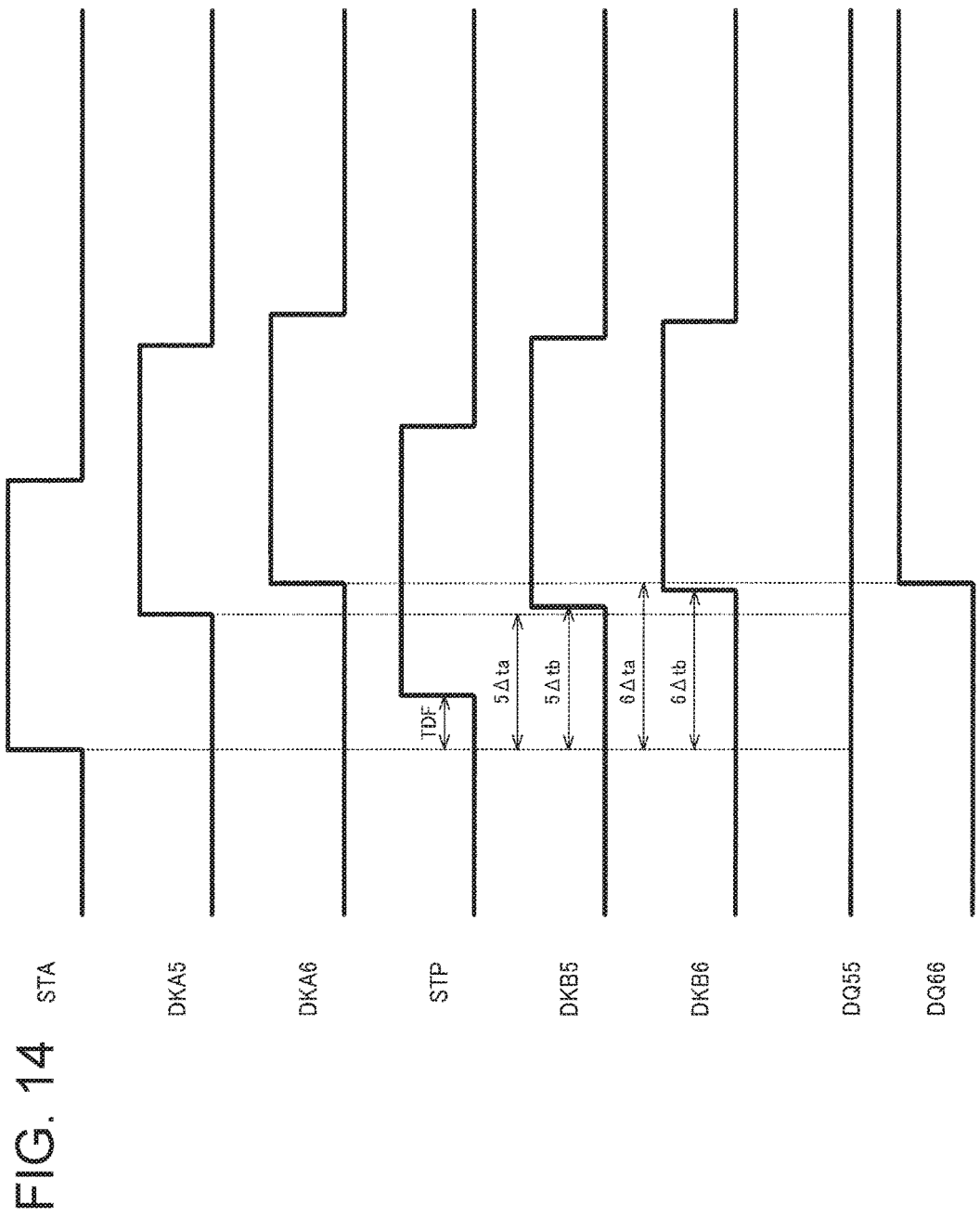
FIG. 14 is a timing chart for explaining an operation of a time-to-digital conversion circuit including first and second circuits.

FIG. 14 is a timing chart for explaining the operation of the time-to-digital conversion circuit 20 including the first and second circuits 160, 170 described above.

As shown in FIG. 14, the signal STP rises with a delay of the time difference TDF to the signal STA. The delayed signals DKA5, DKA6 from the delay circuit 80, which is the replica circuit of the DLL circuit 180, are the signals obtained by delaying the signal STA as much as 5Δta, 6Δta, respectively. Further, the delayed signals DKB5, DKB6 from the second delay circuit, which is the replica circuit of the DLL circuit 190, are the signals obtained by delaying the signal STP as much as 5Δtb, 6Δtb, respectively. In the case in which the time difference TDF exists between 5Δt=5(Δta−Δtb) and 6Δt=6(Δta−Δtb), the rising edge of the delayed signal DKA5 comes before the rising edge of the delayed signal DKB5, and the rising edge of the delayed signal DKA6 comes after the rising edge of the delayed signal DKB6. For example, phase comparators LT55, LT66 latch the logic levels of the delayed signals DKB5, DKB6 at the rising edges of the delayed signals DKA5, DKA6, respectively. Then, the phase comparator LT55 latches the low level ("0") to output as a digital signal DQ55, and the phase comparator LT66 latches the high level ("1") to output as a digital signal DQ66. In this case, digital signals . . . , DQ33, DQ44, and DQ55 become "0," and the digital signals DQ66, DQ77, DQ88, . . . become "1." The time-to-digital conversion circuit 20 converts the digital signals DQ11 through DQnm into a digital value DQ (e.g., "6" in the case of the decimal number).

As described above, by performing the phase comparison between the delayed signals DKA1 through DKAn obtained by delaying the signal STA with the delay circuit 80 as the replica circuit of the DLL circuit 180 and the delayed signals DKB1 through DKBm obtained by delaying the signal STP with the second delay circuit as the replica circuit of the DLL circuit 190, the time difference (TDF) between the signal STA and the signal STP can be measured. The delay amount in each of the delay elements of the DLL circuit 180 is adjusted by the adjustment circuit 40 to Δta, and it results that the delay amount in each of the delay elements of the delay circuit 80 as the replica circuit of the DLL circuit 180 is also adjusted to Δta. Similarly, the delay amount in each of the delay elements of the DLL circuit 190 is adjusted by the second adjustment circuit to Δtb, and it results that the delay amount in each of the delay elements of the second delay circuit as the replica circuit of the DLL circuit 190 is also adjusted to Δtb. Thus, the high-performance time-to-digital conversion can be realized.

Figure 15:
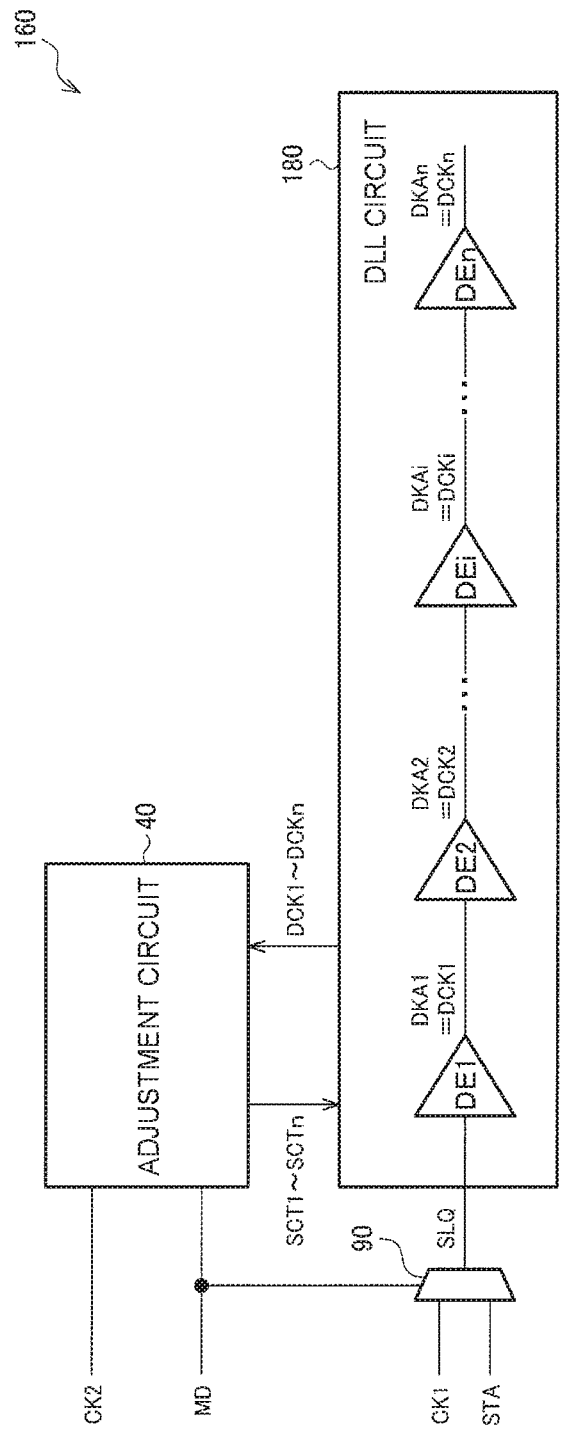
FIG. 15 is a diagram showing a third detailed configuration example of the first circuit.

FIG. 15 shows a third detailed configuration example of the first circuit 160. The first circuit 160 shown in FIG. 15 includes the DLL circuit 180, the adjustment circuit 40, and a selector 90 (a first selector). The DLL circuit 180 and the adjustment circuit 40 are the same as the DLL circuit 180 and the adjustment circuit 40 described with reference to FIG. 5.

The selector 90 inputs either of the clock signal CK1 and the signal STA to the DLL circuit 180. Specifically, the selector 90 selects the clock signal CK1 (the reference clock signal) in a first period, and selects the signal STA in a second period. A signal MD is input to the selector 90 from, for example, a control circuit not shown, and the selector 90 selects either of the clock signal CK1 and the signal STA in accordance with the logic level of the signal MD, and then supplies (outputs) the signal thus selected to the DLL circuit 180 as a signal SLQ. In this configuration example, the delayed clock signals DCK1 through DCKn are input to the comparator array section 150 as the delayed signals DKA1 through DKAn.

It should be noted that the second circuit 170 includes a second selector. Further, the second selector supplies the reference clock signal (CK1) to the second DLL circuit 190 in the first period, and supplies the second signal STP to the second DLL circuit 190 in the second period. In the second period, to the comparator array section 150, there is input the first delayed signal group (DKA1 through DKAn) from the first DLL circuit 180, and there is input the second delayed signal group (DKB1 through DKBm) from the second DLL circuit.

Figure 16:
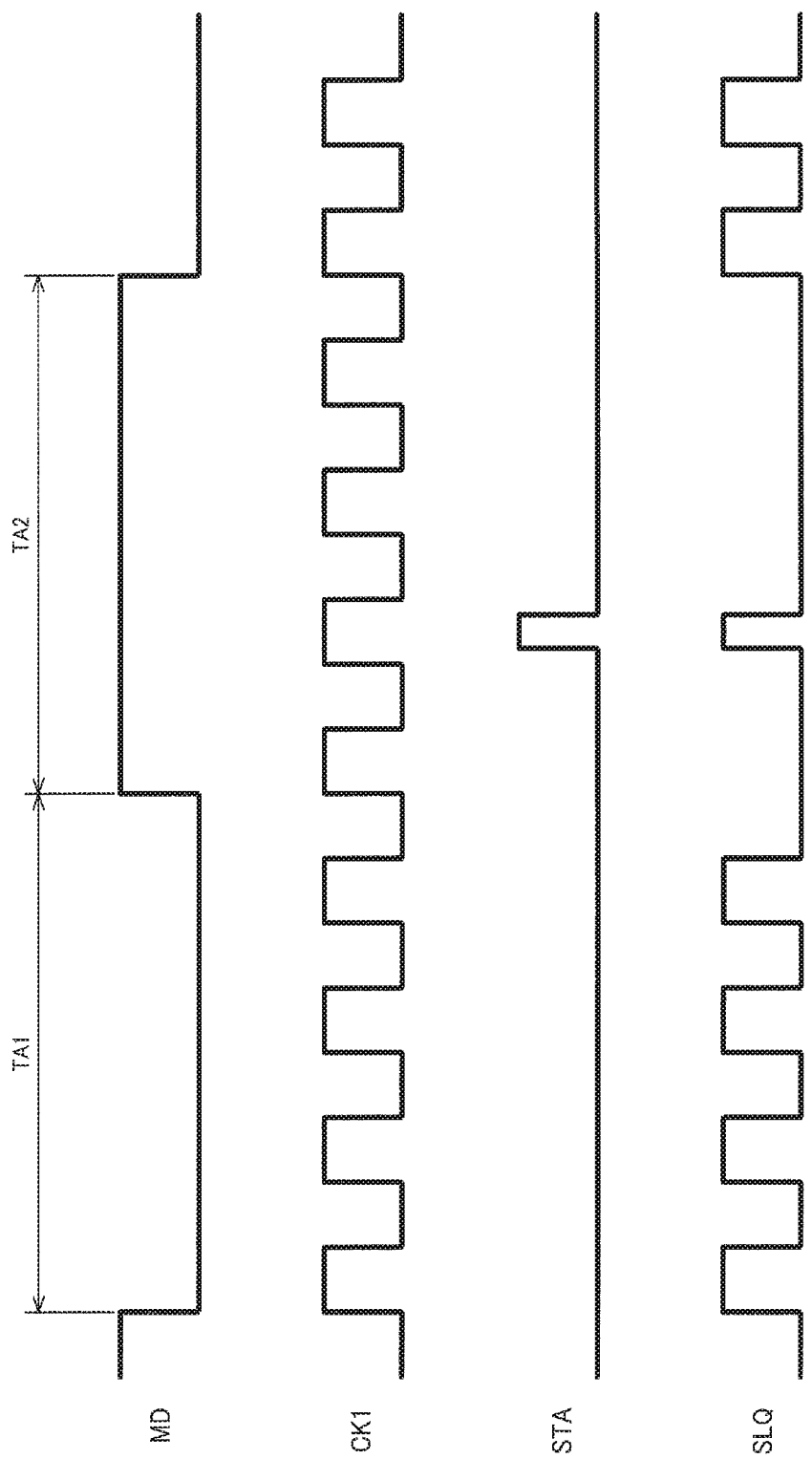
FIG. 16 is a timing chart for explaining the operation of the time-to-digital conversion circuit including the first and second circuits.

FIG. 16 is a timing chart for explaining the operation of the time-to-digital conversion circuit 20 including the first and second circuits 160, 170 described above.

As shown in FIG. 16, the signal MD is in the first logic level (e.g., the low level) in the first period TA, and is in the second logic level (e.g., the high level) in the second period TB. In the first period TA, the selector 90 outputs the clock signal CK1 as the signal SLQ, and the adjustment circuit 40 adjusts the delay amounts of the delay elements DE1 through DEn based on the delayed clock signals DCK1 through DCKn, and the clock signal CK2. In the second period TB, the selector 90 outputs the signal STA as the signal SLQ, and the DLL circuit 180 outputs the delayed signals DKA1 through DKAn to the comparator array section 150. It should be noted that the operation of the time-to-digital conversion circuit 20 in the second period is substantially the same as shown in FIG. 14.

As described above, by performing the phase comparison between the delayed signals DKA1 through DKAn obtained by delaying the signal STA with the DLL circuit 180 and the delayed signals DKB1 through DKBm obtained by delaying the signal STP with the DLL circuit 190 in the second period, the time difference (TDF) between the signal STA and the signal STP can be measured. Since the DLL circuits 180, 190 are directly adjusted in the delay amount by the adjustment circuit 40 and the second adjustment circuit in the first period, it is possible to realize the high-performance time-to-digital conversion compared to the case of using the replica circuits.

It should be noted that although the case in which the same reference clock signal (CK1) is input to the DLL circuits 180, 190 is described above as an example, it is also possible to input reference clock signals (CK1) different from each other to the DLL circuits 180, 190. For example, it is also possible to input the clock signals CK2, CK3 to the DLL circuits 180, 190, and input the clock signal CK1 to the adjustment circuit 40 of the first circuit 160 and the second adjustment circuit of the second circuit 170. In this case, the clock frequencies f1, f2, and f3 of the clock signals CK1, CK2, and CK3 fulfill f1<f3<f2.

7. Modified Examples

Figure 17:
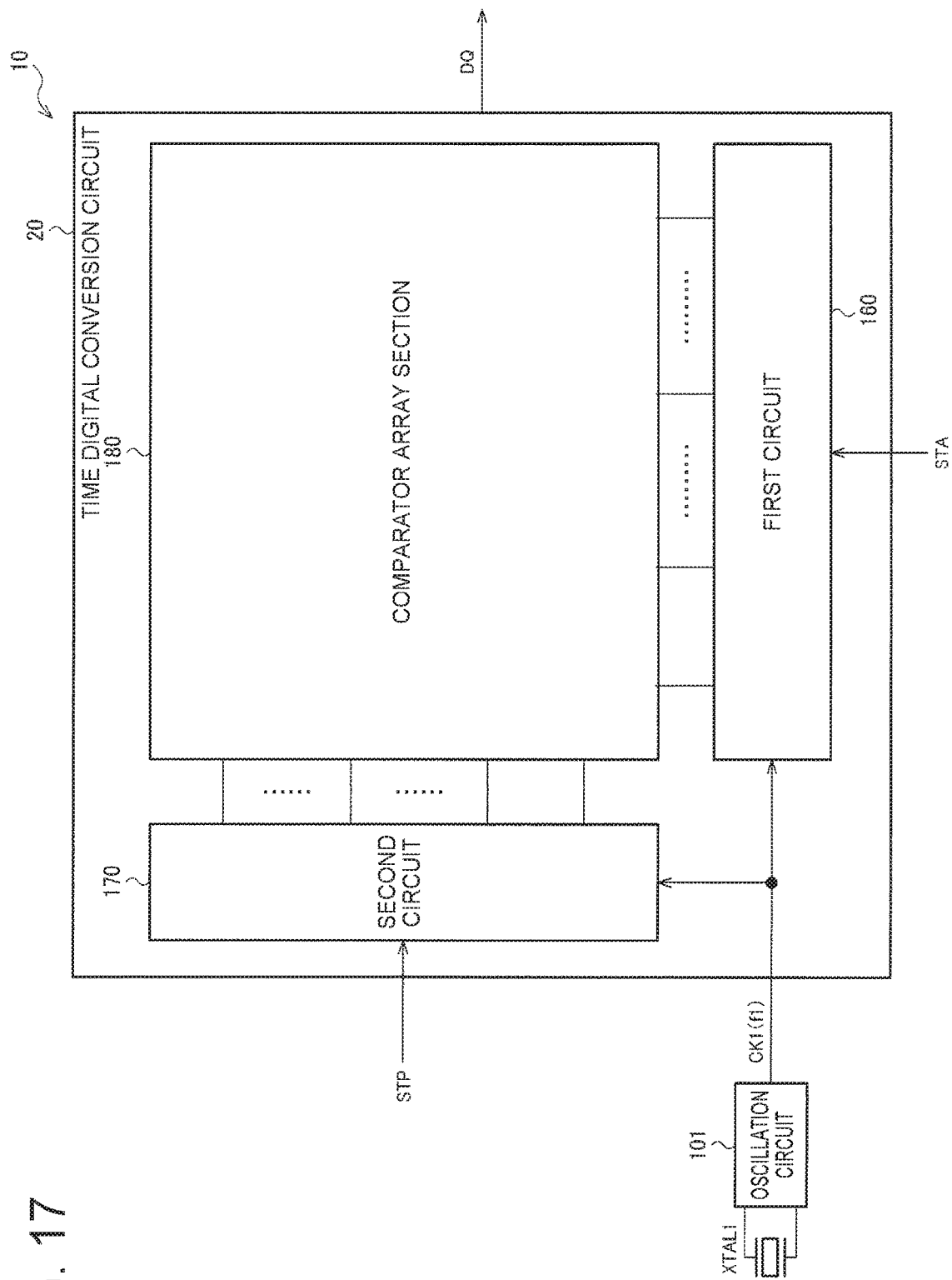
FIG. 17 is diagram showing a modified configuration example of the circuit device.

FIG. 17 shows a modified configuration example of the circuit device 10. The circuit device 10 shown in FIG. 17 includes the time-to-digital conversion circuit 20, and the oscillation circuit 101.

To the time-to-digital conversion circuit 20, there is input the clock signal CK1, and the time-to-digital conversion circuit 20 converts the time into a digital value based on the clock signal CK1. In the example shown in FIG. 17, the time-to-digital conversion circuit 20 adjusts the delay time of the DLL circuits 180, 190 of the first and second circuits 160, 170 based on the clock signal CK1 with the clock frequency f1, and converts the time difference in the transition timing between the signal STA and the signal STP into the digital value DQ.

Figure 18:
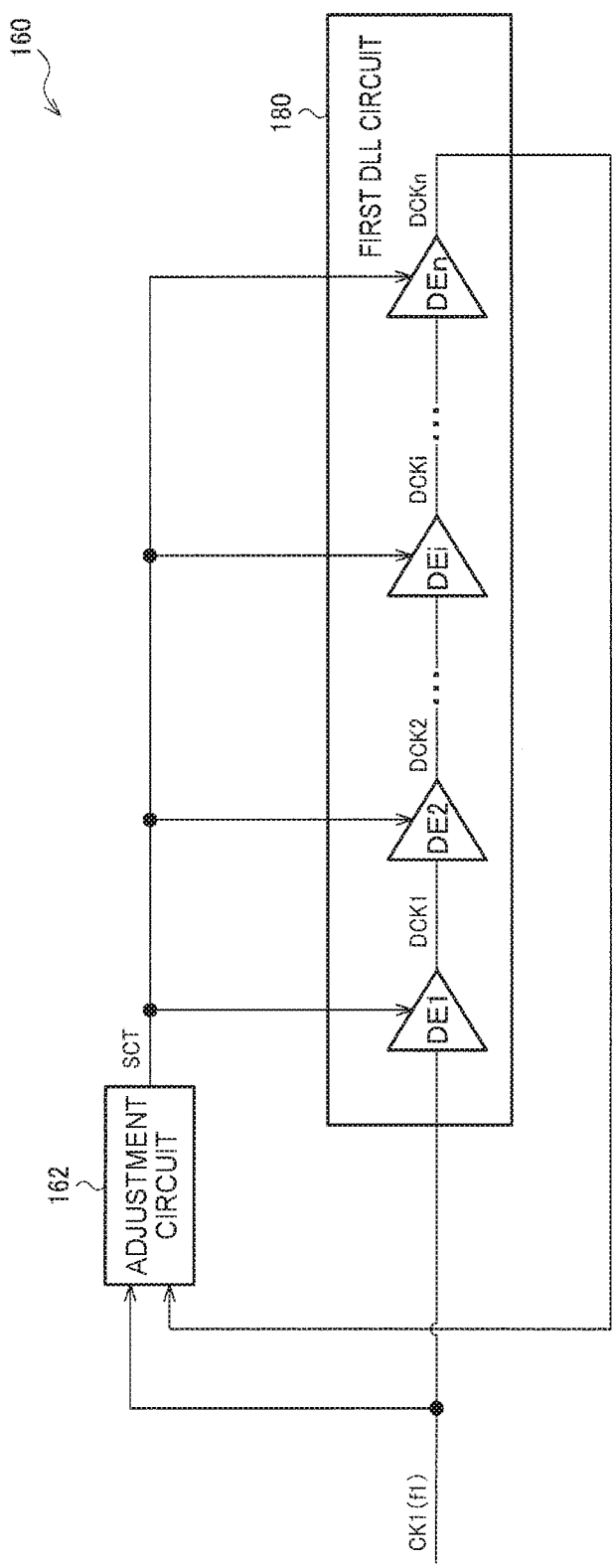
FIG. 18 is a diagram showing a modified configuration example of the first circuit.

FIG. 18 shows a modified configuration example of the first circuit 160. The first circuit 160 shown in FIG. 18 includes the DLL circuit 180 and an adjustment circuit 162.

The DLL circuit 180 has the delay elements DE1 through DEn for sequentially delaying the clock signal CK1 to sequentially output the delayed clock signals DCK1 through DCKn. To the adjustment circuit 162, there are input the delayed clock signal DCKn and the clock signal CK1, and the adjustment circuit 162 adjusts the delay amounts of the delay elements DE1 through DEn based on the delayed clock signal DCKn and the transition timing (the phase) of the clock signal CK1. For example, the adjustment circuit 162 performs the adjustment so that the delayed clock signal DCKn and the transition timing of the clock signal CK1 coincide with each other. Specifically, the adjustment circuit 40 compares (phase-compares) the transition timing of the delayed clock signal DCKn and the transition timing of the clock signal CK1 with each other, and outputs the control signal SCT based on the comparison result. The control signal SCT is a signal for controlling the delay amounts of the delay elements DE1 through DEn. As the adjustment circuit 162, for example, it is possible to adopt substantially the same configuration as the adjustment section ASi shown in FIG. 11, FIG. 12.

It should be noted that as the configuration of delaying the signals STA, STP, there can be adopted, for example, a method of providing the replica circuit of the DLL circuit in substantially the same manner as shown in FIG. 13, or a method of providing a selector to the input of the DLL circuit in substantially the same manner as shown in FIG. 15. Further, although the description is hereinabove presented citing the first circuit 160 as an example, the same also applies to the second circuit 170. Specifically, it is sufficient to replace n with m.

In the modified example described above, the delay amount Δta' per unit delay element in the DLL circuits 180, 190 is expressed as follows. Δta'=1/(n×f1), Δtb'=1/(m×f1) In the case of n<m, Δta'>Δtb' becomes true, and the resolution Δt' of the time-to-digital conversion becomes as follows: Δt'=Δta'−Δtb'.

8. Physical Quantity Measurement Device, Electronic Apparatus, and Vehicle

Figure 19:
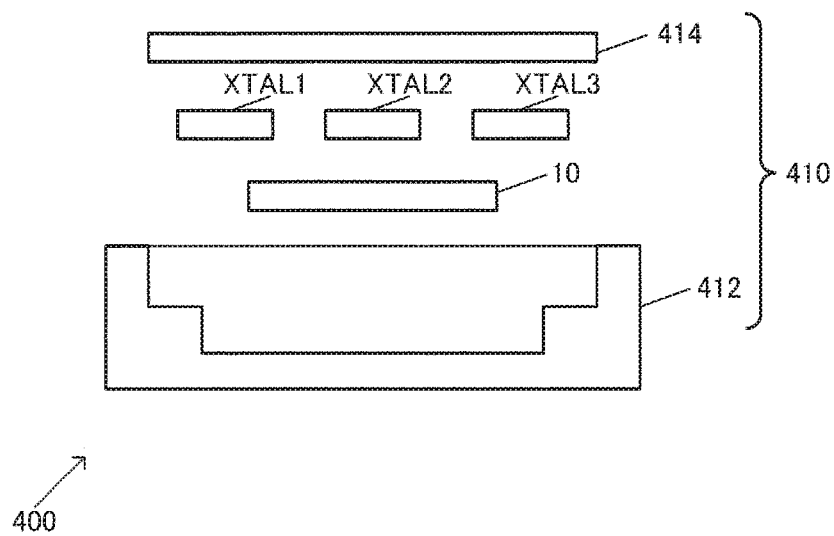
FIG. 19 is a diagram showing a configuration example of a physical quantity measurement device including the circuit device according to the embodiment.

FIG. 19 shows a configuration example of a physical quantity measurement device 400 including the circuit device 10 according to the present embodiment. The physical quantity measurement device 400 includes the circuit device 10 according to the present embodiment, the resonator XTAL1 (a first resonator, a first resonator element) for generating the clock signal CK1, the resonator XTAL2 (a second resonator, a second resonator element) for generating the clock signal CK2, and the resonator XTAL3 (a third resonator, a third resonator element) for generating the clock signal CK3. Further, it is possible for the physical quantity measurement device 400 to include a package 410 for housing the circuit device 10, and the resonators XTAL1, XTAL2, and XTAL3.

The package 410 is formed of, for example, a base section 412 and a lid section 414. The base section 412 is a member made of an insulating material such as ceramic, and having, for example, a box-like shape, and the lid section 414 is a member to be bonded to the base section 412, and having, for example, a plate-like shape. On the bottom surface, for example, of the base section 412, there are disposed external connection terminals (external electrodes) to be connected to external equipment. In an internal space (a cavity) formed by the base section 412 and the lid section 414, there are housed the circuit device 10 and the resonators XTAL1, XTAL2, and XTAL3. Further, by sealing the internal space with the lid section 414, the circuit device 10 and the resonators XTAL1, XTAL2, and XTAL3 are airtightly encapsulated in the package 410.

The circuit device 10 and the resonators XTAL1, XTAL2, and XTAL3 are installed in the package 410. Further, terminals of the resonators XTAL1, XTAL2, and XTAL3 and terminals (pads) of the circuit device 10 (IC) are electrically connected respectively to each other with interconnections of the package 410. The circuit device 10 is provided with the oscillation circuits 101, 102, and 103 for oscillating the resonators XTAL1, XTAL2, and XTAL3, and by oscillating the resonators XTAL1, XTAL2, and XTAL3 using these oscillation circuits 101, 102, and 103, the clock signals CK1, CK2, and CK3 are generated.

For example, as a comparative example, there is considered the case in which the first, second, and third oscillation circuits are provided respectively to the first, second, and third quartz crystal resonators, and the circuit device does not incorporate the first, second, and third oscillation circuits. In this case, it is not possible to realize the phase synchronization of the first, second, and third clock signals due to the synchronizing circuits 110, 115. Further, there is a disadvantage that it is not possible to perform the control process common to the first, second, and third oscillation circuits in the circuit device.

It should be noted that a variety of practical modifications can be made as the configuration of the physical quantity measurement device 400. For example, in the case of adopting the modified example shown in FIG. 17 and FIG. 18, the resonators XTAL2, XTAL3, and the oscillation circuits 101, 102 are omitted. Further, it is also possible for, for example, the base section 412 to have a plate-like shape, and for the lid section 414 to have a shape provided with a recess formed inside the lid section 414. Further, a variety of practical modifications can be made on the installation configuration and the wiring connection of the circuit device 10 and the resonators XTAL1, XTAL2, and XTAL3 in the package 410. Further, the resonators XTAL1, XTAL2, and XTAL3 are not required to be configured as completely separated parts, but can also be first, second, and third oscillation areas provided to a single member.

Figure 20:
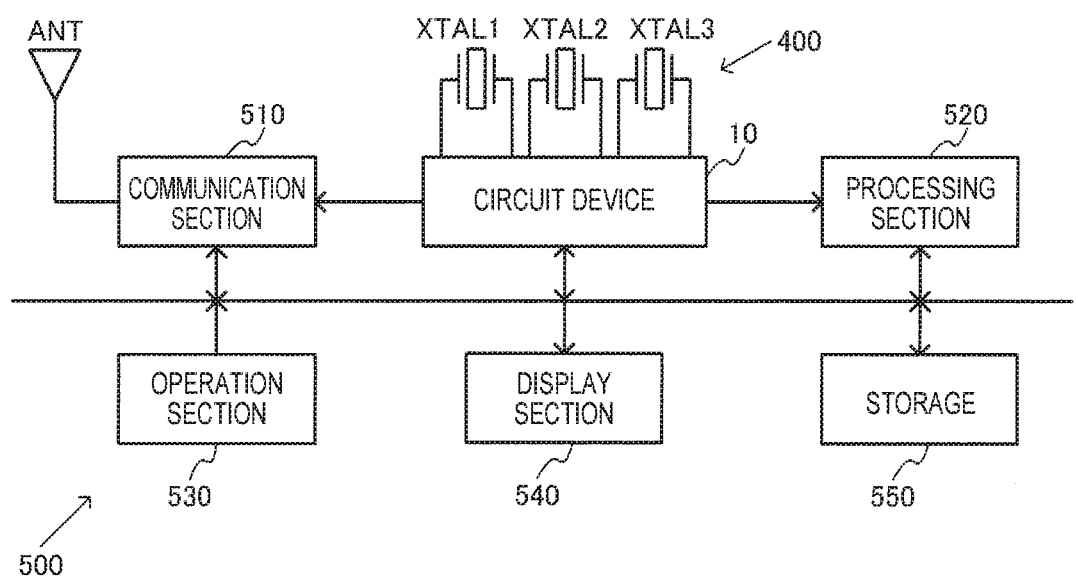
FIG. 20 is a diagram showing a configuration example of an electronic apparatus including the circuit device according to the embodiment.

FIG. 20 shows a configuration example of an electronic apparatus 500 including the circuit device 10 according to the present embodiment. The electronic apparatus 500 includes the circuit device 10 according to the present embodiment, the resonators XTAL1, XTAL2, and XTAL3, and a processing section 520. Further, the electronic apparatus 500 can include a communication section 510, an operation section 530, a display section 540, a storage 550, and an antenna ANT. The circuit device 10 and the resonators XTAL1, XTAL2, and XTAL3 constitute the physical quantity measurement device 400. It should be noted that the configuration of the electronic apparatus 500 is not limited to the configuration shown in FIG. 20, but a variety of practical modifications such as elimination of some of the constituents (e.g., the resonators XTAL2, XTAL3) or addition of other constituents are possible.

As the electronic apparatus 500, there can be assumed a variety of apparatuses such as a measurement instrument for measuring a physical quantity such as a distance, time, flow speed, or a flow rate, a biological information measurement apparatus (e.g., a ultrasonic measurement device, a sphygmograph, and a blood-pressure measurement device), an in-car apparatus (e.g., equipment for automated driving), a network-related apparatus such as a base station, or a router, a wearable apparatus such as a head-mounted display device, or a timepiece related apparatus, a printer, a projection apparatus, a robot, a portable information terminal (e.g., a smartphone, a cellular phone, a portable video game player, a laptop PC, or a tablet PC), a content supply terminal for delivering contents, a video apparatus such as a digital camera or a video camera.

The communication section 510 (a wireless circuit) performs a process of receiving data externally via the antenna ANT and transmitting data to the outside. The processing section 520 performs a control process of the electronic apparatus 500, a variety of types of digital processing of the data transmitted or received via the communication section 510. Further, the processing section 520 performs a variety of processes using the physical quantity information measured by the physical quantity measurement device 400. The function of the processing section 520 can be realized by a processor such as a microcomputer.

The operation section 530 is for allowing the user to perform an input operation, and can be realized by operation buttons, a touch panel display, and so on. The display section 540 is for displaying a variety of types of information, and can be realized by a display using a liquid crystal, an organic EL, and so on. It should be noted that in the case of using the touch panel display as the operation section 530, it results that the touch panel display also functions as the operation section 530 and the display section 540. The storage 550 is for storing the data, and the function thereof can be realized by a semiconductor memory such as a RAM or a ROM, a hard disk drive (HDD), or the like.

Figure 21:
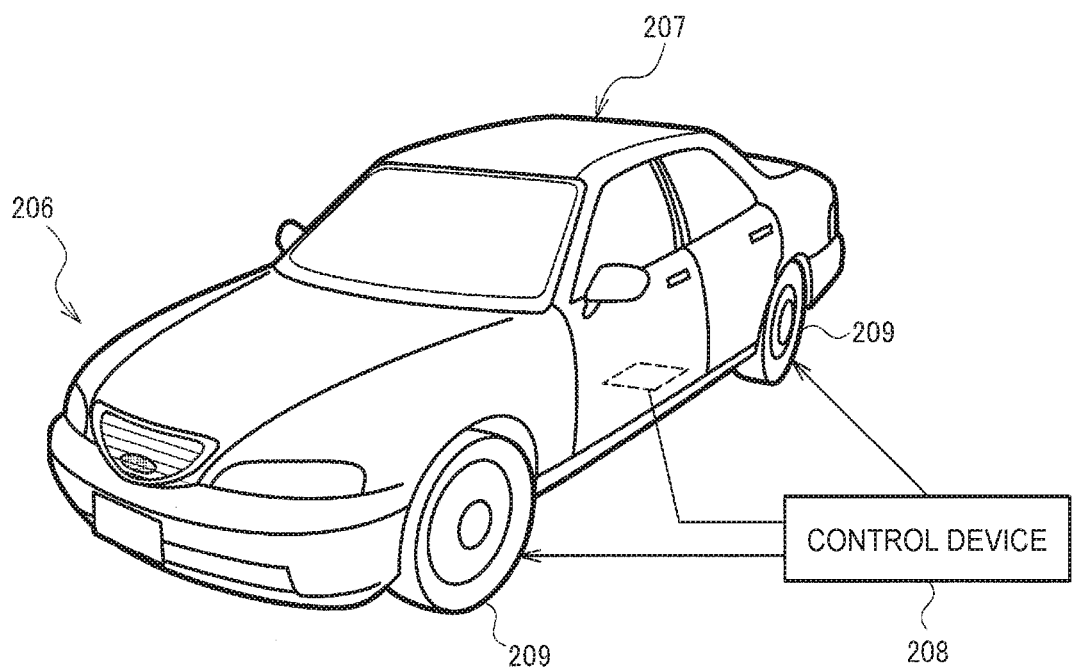
FIG. 21 is a diagram showing an example of a vehicle including the circuit device according to the embodiment.

FIG. 21 shows an example of a vehicle including the circuit device according to the present embodiment. The circuit device according to the present embodiment can be incorporated in a variety of vehicles such as a car, an airplane, a motorbike, a bicycle, a robot, a ship, and a boat. The vehicle is equipment or an apparatus, which is provided with a drive mechanism such as an engine or an electric motor, a steering mechanism such as a steering wheel or a helm, and a variety of electronic apparatuses (in-car equipment), and moves on the ground, in the air, or on the sea. FIG. 21 schematically shows a car 206 as a specific example of the vehicle. The car 206 (the vehicle) incorporates a physical quantity measurement device (not shown) having the circuit device according to the present embodiment and an resonator. The control device 208 performs a variety of control processes based on the physical quantity information measured by the physical quantity measurement device. For example, in the case in which the distance information of an object located in the periphery of the car 206 is measured as the physical quantity information, the control device 208 performs a variety of control processes for the automated driving using the distance information thus measured. The control device 208 controls the stiffness of the suspension, and controls the brake of each of the wheels 209 in accordance with, for example, the attitude of a vehicle body 207. It should be noted that the apparatus incorporating the circuit device or the physical quantity measurement device according to the present embodiment is not limited to such a control device 208, but the circuit device or the physical quantity measurement device according to the present embodiment can be incorporated in a variety of apparatuses (in-car equipment) provided to a vehicle such as the car 206.

It should be noted that although the present embodiment is hereinabove explained in detail, it should easily be understood by those skilled in the art that it is possible to make a variety of modifications not substantially departing from the novel matters and the advantage of the invention. Therefore, all of such modified examples should be included in the scope of the invention. For example, a term described at least once with a different term having a broader sense or the same meaning in the specification or the accompanying drawings can be replaced with that different term in any part of the specification or the accompanying drawings. Further, all of the combinations of the present embodiment and the modified examples are also included in the scope of the invention. Further, the configurations and the operations of the circuit device, the physical quantity measurement device, the electronic apparatus, and the vehicle are not limited to those explained in the present embodiment, but can be implemented with a variety of modifications.

The entire disclosure of Japanese Patent Application No. 2016-187861, filed Sep. 27, 2016 is expressly incorporated by reference herein.

What is claimed is:
1. A circuit device comprising:
a first circuit having a first delay locked loop (DLL) circuit having a plurality of delay elements, and adapted to delay a first signal;
a second circuit having a second DLL circuit having a plurality of delay elements, and adapted to delay a second signal; and
a comparator array section, which has a plurality of phase comparators arranged in a matrix, to which a first delayed signal group from the first circuit and a second delayed signal group from the second circuit are input, and which outputs a digital signal corresponding to a time difference in transition timing between the first signal and the second signal, wherein, to output the digital signal, the comparator array section is configured to separately compare each of a plurality of delayed signals in the first delayed signal group to each of a plurality of delayed signals in the second delayed signal group.
2. The circuit device according to claim 1, wherein
a phase comparator located in an i-th column and a j-th row of the comparator array section (i, j are each an integer no smaller than 1) performs phase comparison between an i-th delayed signal out of the first delayed signal group from the first circuit and a j-th delayed signal out of the second delayed signal group from the second circuit.

3. The circuit device according to claim 1, wherein
in the first DLL circuit, a delay amount of a delay element is adjusted using a difference in frequency between a first clock signal and a second clock signal, and
in the second DLL circuit, a delay amount of a delay element is adjusted using a difference in frequency between the first clock signal and a third clock signal.

4. The circuit device according to claim 3, wherein
the first circuit includes a first adjustment circuit to which a delayed clock signal from the delay element of the first DLL circuit, and the second clock signal with a second clock frequency lower than a first clock frequency of the first clock signal are input, and which adjust the delay amount of the delay element of the first DLL circuit using the frequency difference between the first clock frequency and the second clock frequency, and
the second circuit includes a second adjustment circuit to which a delayed clock signal from the delay element of the second DLL circuit, and the third clock signal with a third clock frequency lower than the first clock frequency of the first clock signal are input, and which adjust the delay amount of the delay element of the second DLL circuit using the frequency difference between the first clock frequency and the third clock frequency.

5. The circuit device according to claim 3, wherein
the first clock signal is a clock signal generated using a first resonator,
the second clock signal is a clock signal generated using a second resonator, and
the third clock signal is a clock signal generated using a third resonator.

6. The circuit device according to claim 1, wherein
the first circuit has a first delay circuit adapted to delay the first signal with a delay amount corresponding to a signal delay in the first DLL circuit, and output the first delayed signal group to the comparator array section, and
the second circuit has a second delay circuit adapted to delay the second signal with a delay amount corresponding to a signal delay in the second DLL circuit, and output the second delayed signal group to the comparator array section.

7. The circuit device according to claim 6, wherein
the first delay circuit is a replica circuit of the first DLL circuit, and
the second delay circuit is a replica circuit of the second DLL circuit.

8. The circuit device according to claim 1, wherein
the first circuit has a first selector adapted to supply a reference clock signal to the first DLL circuit in a first period, and supply the first signal to the first DLL circuit in a second period,
the second circuit has a second selector adapted to supply a reference clock signal to the second DLL circuit in the first period, and supply the second signal to the second DLL circuit in the second period, and
in the second period, to the comparator array section, the first delayed signal group is input from the first DLL circuit, and the second delayed signal group is input from the second DLL circuit.

9. A physical quantity measurement device comprising:
the circuit device according to claim 1; and
a first resonator adapted to generate a first clock signal.

10. A physical quantity measurement device comprising:
the circuit device according to claim 2; and
a first resonator adapted to generate a first clock signal.

11. A physical quantity measurement device comprising:
the circuit device according to claim 3; and
a first resonator adapted to generate a first clock signal.

12. A physical quantity measurement device comprising:
the circuit device according to claim 4; and
a first resonator adapted to generate a first clock signal.

13. The physical quantity measurement device according to claim 9, further comprising:
a second resonator adapted to generate a second clock signal, and
a third resonator adapted to generate a third clock signal.

14. An electronic apparatus comprising:
the circuit device according to claim 1.

15. An electronic apparatus comprising:
the circuit device according to claim 2.

16. An electronic apparatus comprising:
the circuit device according to claim 3.

17. An electronic apparatus comprising:
the circuit device according to claim 4.

18. A vehicle comprising:
the circuit device according to claim 1.

19. A vehicle comprising:
the circuit device according to claim 2.

20. A vehicle comprising:
the circuit device according to claim 3.

* * * * *